(12) United States Patent
Kambe et al.

(10) Patent No.: US 6,821,649 B2
(45) Date of Patent: Nov. 23, 2004

(54) ORGANIC EL DEVICE AND PREPARATION METHOD

(75) Inventors: Emiko Kambe, Tokyo (JP); Masahiro Shinkai, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/222,778

(22) Filed: Aug. 19, 2002

(65) Prior Publication Data

US 2003/0044645 A1 Mar. 6, 2003

(30) Foreign Application Priority Data

Aug. 20, 2001 (JP) .......................... 2001-249456
Aug. 23, 2001 (JP) .......................... 2001-253409
Mar. 19, 2002 (JP) .......................... 2002-076430

(51) Int. Cl.$^7$ .............................. H05B 33/14
(52) U.S. Cl. ................ 428/690; 428/704; 428/917; 428/209; 428/689; 428/461; 428/500; 313/504; 313/506; 252/301.16; 252/301.27; 252/301.28; 252/301.29; 252/301.32
(58) Field of Search .................. 428/690, 704, 428/917, 209, 689, 461, 500; 313/504, 506; 252/301.16, 301.27, 301.28, 301.29, 301.32

(56) References Cited

U.S. PATENT DOCUMENTS 6,396,209 B1 * 5/2002 Kido et al. ............... 313/504
2002/0004146 A1 * 1/2002 Kido et al. ............... 428/690

FOREIGN PATENT DOCUMENTS

| JP | 4-2096 | 1/1992 |
| JP | 4-337284 | 11/1992 |
| JP | 10-270171 | 10/1998 |
| JP | 10-270172 | 10/1998 |
| JP | 11-40358 | 2/1999 |
| JP | 11-54270 | 2/1999 |
| JP | 11-233262 | 8/1999 |
| JP | 2000-77185 | 3/2000 |
| JP | 2000-182774 | 6/2000 |

OTHER PUBLICATIONS

Translation of JP–11–233262.*
Translation of JP–2000–077185.*
Translation of JP–2000–182774.*

* cited by examiner

Primary Examiner—Deborah Jones
Assistant Examiner—Ling Xu
(74) Attorney, Agent, or Firm—Oblon, Spivak, McClelland, Maier & Neustadt, P.C.

(57) ABSTRACT

In an organic EL device comprising a cathode, an anode, and two or more stacked organic layers therebetween including a light emitting layer, an electron injecting organic layer containing an organic salt or complex of a metal having a standard electrode potential of more negative than −1.8 V at 25° C. is formed close to the cathode by coating, and an organic layer containing a high molecular weight EL material is disposed close to the electron injecting organic layer. A multilayer structure of organic layers can be formed by coating, and the organic EL device has a high luminance, high efficiency, high reliability, long life and ease of handling.

14 Claims, 2 Drawing Sheets

ORGANIC EL DEVICE AND PREPARATION METHOD

This invention relates to organic electroluminescent (EL) devices having organic layers formed and stacked by coating, and more particularly, organic EL devices having high reliability and efficiency. It also relates to a method for preparing organic EL devices using a coating solvent capable of forming a stable amorphous film without attacking any underlying layer. It further relates to organic EL devices using stable metal salts which have never been used as the cathode or electron injecting electrode in the art.

BACKGROUND OF THE INVENTION

Since the announcement by Kodak of multilayer structure organic EL devices using a vacuum evaporation technique, the development of organic EL displays has been a great concern and reached the verge of commercial application.

In organic EL devices, what becomes a problem in injecting electrons from a metallic cathode into an organic compound which is deemed to be substantially insulating is the energy barrier. It is desired to reduce the energy barrier.

From the standpoint of reducing the injection barrier, metals having a low work function and salts or oxides thereof are currently used as the cathode or electron injecting electrode.

For the fabrication of multilayer structure organic EL devices, vacuum evaporation of low molecular weight dyes is a common practice. The vacuum evaporation technique, however, is not regarded efficient as the device fabrication process because it is difficult to form homogeneous, defect-free thin films and time consuming in depositing a plurality of organic layers.

JP-A 4-337284, JP-A 11-54270 and JP-A 11-40358 disclose organic EL devices wherein organic layers are formed by a coating technique which is generally believed efficient in productivity. However, these patents use organic layers of the single layer structure, and do not take into account organic layers of the multilayer structure capable of more efficient light emission.

JP-A 4-2096 and JP-A 2000-77185 disclose organic EL devices wherein organic layers of the multilayer structure are formed by coating. In Examples of JP-A 4-2096, a hole injecting and transporting layer is formed by coating a polymeric hole injecting and transporting material, or a hole injecting and transporting material and a polymeric binder, and a light emitting layer is formed thereon by coating a light emitting material and a polymeric binder. In JP-A 2000-77185, an organic polymer having a siloxane structure is contained in organic layers to be laminated. When organic layers of multilayer structure are formed, at least a lower side organic layer must contain the organic polymer having a siloxane structure. According to its disclosure, organic polymers having a siloxane structure are contained in organic layers to be laminated, whereupon the coatings are crosslinked and insolubilized to unite the polymers together to join the layers; or a coating solution containing an organic polymer having a siloxane structure and another organic polymer having a carbon base structure and a less compatibility therewith is coated, whereupon the polymers are laminated by utilizing two phase separation within the coated layers. In Examples, respective organic layers to be laminated are formed by coating solutions of respective functional compounds and a silicone resin in a common solvent (typically, tetrahydrofuran THF), followed by crosslinking; and respective organic layers are formed by using an organic polymer having a carbon base structure and causing two phase separation. In these multilayer structures, however, particularly when a common coating solvent is used, the construction of organic layers which can be formed as a laminate is restricted, and the compound which can be used in introducing a crosslinking structure is limited. The functional groups which must be introduced into the light emitting layer for crosslinking serve to reduce the efficiency of light emission of the resulting organic EL devices.

Polymeric organic EL devices which are now generally used often rely on the structure that a Ca cathode is formed on a light emitting polymer by evaporation. In such electrodes, the electrode material can diffuse into the polymer to become a dopant or to quench luminescence, resulting in devices which are often short-lived in continuous driving. Also, to prevent the Ca cathode from oxidation, the conditions of sealing after the cathode evaporation must be strictly managed.

Such a situation prevails not only with the Ca cathode, but also often prevails with many cathodes known as electron injecting electrode. Then a cathode or auxiliary electrode of an ordinary wiring material, typically Al is often used in combination with the electron injecting electrode.

There are known some improvements in such cathodes. For the purpose of using as the cathode material a stable metal which has been commonly used as the conventional wiring conductor, it is proposed to construct an organic layer in close contact with the cathode electrode so as to provide a lower energy barrier to electron injection (see JP-A 10-270171, JP-A 10-270172, JP-A 11-233262 and JP-A 2000-182774).

Illustratively, JP-A 10-270171 discloses the provision of an organic compound layer doped with a metal which functions as a donor (electron donative) dopant, at the interface with the cathode electrode. More specifically, on a light emitting layer resulting from evaporation of tris(8-quinolinolato)aluminum complex, a layer of tris(8-quinolinolato)aluminum complex doped with Li or Mg, or a layer of bathophenanthroline doped with Li is formed by evaporation. Alternatively, poly(p-phenylene vinylene) is deposited as a light emitting layer by the method of Burroughes et al., a polystyrene film containing anthracene/Li is then spin coated in a nitrogen atmosphere, which serves as a metal doping layer, and a cathode electrode is formed thereon by evaporation of Al.

JP-A 10-270172 teaches the provision of an organic compound layer doped with a metal oxide or metal salt at the interface with a cathode electrode. More specifically, on a light emitting layer resulting from evaporation of tris(8-quinolinolato)aluminum complex, a layer of tris(8-quinolinolato)aluminum complex doped with LiF or $Li_2O$ or a layer of bathophenanthroline doped with $Li_2O$ is formed, which serves as a doping layer, and a cathode electrode is formed thereon by evaporation of Al.

JP-A 11-233262 discloses that an organic layer in close contact with a cathode electrode is constructed from an organic metal complex containing at least one alkali metal ion, alkaline earth metal ion or rare earth metal ion and that the cathode electrode is constructed from a metal capable of reducing the metal ion in the organic metal complex into a metal in vacuum. More specifically, on a light emitting layer resulting from evaporation of tris(8-quinolinolato)aluminum complex, an organic layer (or electron injecting layer) of mono(8-quinolinolato)lithium complex, mono(8-quinolinolato)sodium complex, mono(2,2,6,6-tetramethyl-3,5-heptanedionato)lithium complex, mono(2,2,6,6- tetramethyl-3,5-heptanedionato)sodium complex, di(2,2,6,6-tetramethyl-3,5-heptanedionato)magnesium complex, di(2,2,6,6-tetramethyl-3,5-heptanedionato)calcium complex or tri(1,3-phenyl-1,3-propanedionato)mono(bathophenanthroline)europium complex is formed by evaporation, and a cathode electrode is formed thereon by evaporation of Al.

JP-A 2000-182774 discloses that a mixed layer comprising an organic metal complex containing at least one alkali metal ion, alkaline earth metal ion or rare earth metal ion and an electron transporting organic compound is formed as an organic layer in close contact with a cathode electrode, and that the cathode electrode is constructed from a metal capable of reducing the metal ion in the organic metal complex in the mixed layer into a metal in vacuum. More specifically, on a light emitting layer resulting from evaporation of tris(8-quinolinolato)aluminum complex, a mixed layer of tris(8-quinolinolato)aluminum complex and mono(8-quinolinolato)lithium complex is formed by evaporation, and a cathode electrode is formed on the mixed layer by evaporation of Al. The materials of the cathode electrode are limited to high-melting metals.

However, these patents essentially correspond to devices of the type wherein organic layers are formed by evaporation. Heretofore, no study has been made on the technique required to form a multilayer structure by a coating method nor on the electron injecting layer which is optimum to enhance the efficiency of polymeric light emitting material. JP-A 10-270171 describes the coating of a metal doping layer on a polymeric light emitting layer while the formation of the polymeric light emitting layer is conducted by the method of Burroughes et al. The method of Burroughes et al. involves coating a precursor of poly(p-phenylene vinylene), often abbreviated as PPV, and heating it for deacidification, resulting in PPV. The PPV is a polymer which is insoluble in any solvents and allows an overlying layer to be readily coated thereon, helping form a multilayer structure. On the other hand, the finished PPV raises a problem with respect to uniformity and has the drawback that device characteristics are very poor as compared with the recently developed soluble PPV. Since metallic Li having a considerably high reactivity is admixed, control of the atmosphere is very difficult. To coat a low molecular weight anthracene which is likely to crystallize, it must be dispersed in a non-conductive polystyrene polymer.

For the above reason or other, when an organic layer is formed by a coating method, it is desired to have a technique of using an inexpensive and stable cathode material and ensuring a fully high electron injection efficiency. In the case of coating which entails a combination of a solvent with a material, the material suited for the evaporation is not directly applicable.

When a metal having a low work function is used as the cathode, it is very unstable independent of the way of forming the organic layer. Attempts have been made to stabilize the cathode metal. Such a metal is used as an alloy as disclosed in, for example, JP-A 5-198380.

However, it is still necessary to use metals having a low work function and salts thereof, which are cumbersome to handle during the manufacture. Degradation of such metals is still a problem.

SUMMARY OF THE INVENTION

A first object of the invention is to provide an organic EL device having a multilayer structure of organic layers formed by coating, featuring a high efficiency, high reliability and ease of handling as well as a high luminance and a long lifetime; and a method for preparing an organic EL device having a high efficiency and high reliability which enables organic layers to be formed in a multilayer structure by coating, so that the device can be simply prepared within a short time.

A second object of the invention is to provide an organic EL device which can be driven with a low voltage due to the use of a metal salt of a stable metal species in an electron injecting layer, is easy to handle and has a long luminance half-life.

A third object of the invention is to provide an organic EL device in which a multilayer structure of organic layers can be formed by coating so that the device can be simply prepared within a short time, and which has a high emission efficiency, a long life, and high reliability.

A first embodiment of the invention provides an organic EL device comprising a cathode, an anode, and two or more stacked organic layers therebetween including a light emitting layer, at least one layer of the two or more organic layers being formed by coating. The organic layer disposed close to the cathode is an electron injecting organic layer containing at least one compound selected from organic metal salts and organic metal complexes of a metal having a standard electrode potential of more negative than −1.8 V at 25° C., and formed by coating. An organic layer containing a high molecular weight EL material is disposed close to the electron injecting organic layer on the cathode side.

Preferably, the metal has a standard electrode potential of from −3.1 V to −2.2 V at 25° C. Also preferably, the metal has a work function of up to 3.8 eV. The metal is typically an alkali metal (I), alkaline earth metal (II) or rare earth metal (III).

In a preferred embodiment, the electron injecting organic layer disposed close to the cathode contains an organic metal complex which has a ligand of the following formula (L-1):

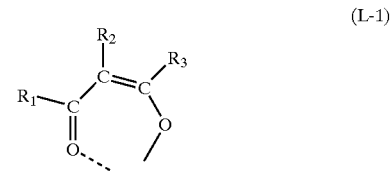

(L-1)

wherein $R_1$, $R_2$ and $R_3$ are each independently hydrogen, an alkyl or aryl group, and $R_2$ and $R_3$ may bond together to form a ring.

Preferably, the high molecular weight EL material has a weight average molecular weight of at least 5,000. More preferably, the high molecular weight EL material is selected from the group consisting of polyfluorene and derivatives thereof, poly(p-phenylene vinylene) and derivatives thereof, poly(biphenylene vinylene) and derivatives thereof, poly(terphenylene vinylene) and derivatives thereof, poly(naphthylene vinylene) and derivatives thereof, poly(thienylene vinylene) and derivatives thereof, polythiophene and derivatives thereof, polyvinyl compounds, polyacrylate derivatives, and polymethacrylate derivatives.

In a further preferred embodiment, the electron injecting organic layer disposed close to the cathode further contains an electron transporting material which is a compound having an oxadiazole ring, triazole ring, quinoxaline ring, phenanthroline ring, quinolinol ring, thiadiazole ring, pyridine ring or cyano group.

Preferably, the electron injecting organic layer disposed close to the cathode has been coated and crosslinked.

The invention also provides a method for preparing an organic EL device comprising a substrate, a first electrode on the substrate, two or more stacked organic layers including a light emitting layer on the first electrode, and a second electrode formed on the organic layers, at least one layer of the two or more organic layers being formed by coating, wherein an organic layer containing a high molecular weight EL material and an electron injecting organic layer containing at least one compound selected from organic metal salts and organic metal complexes of a metal having a standard electrode potential of more negative than −1.8 V at 25° C. are formed in a stacked manner, the electron injecting organic layer is formed close to the first or second electrode by coating.

In one preferred method, the first electrode is an anode, the second electrode is a cathode, the organic layer containing a high molecular weight EL material is formed as a lower side organic layer, the electron injecting organic layer containing at least one compound selected from organic metal salts and organic metal complexes of a metal having a standard electrode potential of more negative than −1.8 V at 25° C. is formed as an upper side organic layer lying on the lower side organic layer, by coating a solution of the at least one compound in a solvent which is selected from the group consisting of (i) a chain compound of 3 to 6 carbon atoms in total, having on the molecule at least one alkoxy group of 1 to 3 carbon atoms, carbonyl group, or ester group of 2 to 3 carbon atoms, and a hydroxyl group at the α- and/or β-position thereto, (ii) a chain compound of 3 to 6 carbon atoms in total, having on the molecule a dialkylamide group of 2 to 4 carbon atoms, (iii) an ester form of chain compound having 5 to 8 carbon atoms in total, and (iv) a carbonate form of chain compound having 4 to 7 carbon atoms in total, and the cathode is formed on the electron injecting organic layer serving as the upper side organic layer.

In the preferred method, the organic layer containing a high molecular weight EL material serving as the lower side organic, layer is formed by coating.

In another aspect of the first embodiment, the invention provides an organic EL device comprising a cathode, an anode, at least one organic layer therebetween including a light emitting layer, an electron injecting layer between the cathode and the organic layer, wherein the electron injecting layer contains at least one salt selected from inorganic metal salts and organic metal salts of a metal having a standard electrode potential of from −1.8 V to −0.8 V at 25° C.

Preferably, the metal has a standard electrode potential of from −1.7 V to −1.15 V at 25° C. More preferably, the metal has a work function of at least 4.0 eV. The metal is typically Al (III), Mn (II) or Zr (IV). The preferred metal salt is a carboxylate, alkoxide, phenoxide, halide or dialkylamide.

A second embodiment of the invention provides an organic EL device comprising, in order, a substrate, a first electrode on the substrate, two or more stacked organic layers on the first electrode including a light emitting layer, and a second electrode on the organic layers. At least one layer of the two or more stacked organic layers other than the light emitting layer contains at least one high or low molecular weight compound selected from the group consisting of oxadiazole, triazole, thiadiazole, quinoline, quinoxaline, phenanthroline, and derivatives thereof. The light emitting layer contains a π-conjugated polymer, polyvinyl compound, polyacrylate, polymethacrylate or a derivative thereof. The organic layers are formed by coating.

Preferably, the second electrode is made of a metal salt, metal oxide or metal alloy.

In a preferred embodiment, the first electrode is an anode, the second electrode is a cathode, the light emitting layer is formed as a lower side organic layer, the at least one layer containing at least one high or low molecular weight compound selected from the group consisting of oxadiazole, triazole, thiadiazole, quinoline, quinoxaline, phenanthroline, and derivatives thereof is formed as an upper side organic layer lying on the lower side organic layer, by coating a solution of the at least one high or low molecular weight compound in a solvent which is selected from the group consisting of (i) a chain compound of 3 to 6 carbon atoms in total, having on the molecule at least one alkoxy group of 1 to 3 carbon atoms, carbonyl group, or ester group of 2 to 3 carbon atoms, and a hydroxyl group at the α- and/or β-position thereto, (ii) a chain compound of 3 to 6 carbon atoms in total, having on the molecule a dialkylamide group of 2 to 4 carbon atoms, (iii) an ester form of chain compound having 5 to 8 carbon atoms in total, and (iv) a carbonate form of chain compound having 4 to 7 carbon atoms in total.

The polymer in the light emitting layer preferably has a weight average molecular weight of at least 5,000 and is often selected from the group consisting of polyfluorene and derivatives thereof, poly(p-phenylene vinylene) and derivatives thereof, poly(biphenylene vinylene) and derivatives thereof, poly(terphenylene vinylene) and derivatives thereof, poly(naphthylene vinylene) and derivatives thereof, poly(thienylene vinylene) and derivatives thereof, polythiophene and derivatives thereof, polyvinyl compounds, polyacrylate derivatives, and polymethacrylate derivatives.

DESCRIPTION OF THE PREFERRED EMBODIMENTS

Now the first embodiment of the invention is described.
First Embodiment

Figure 1:
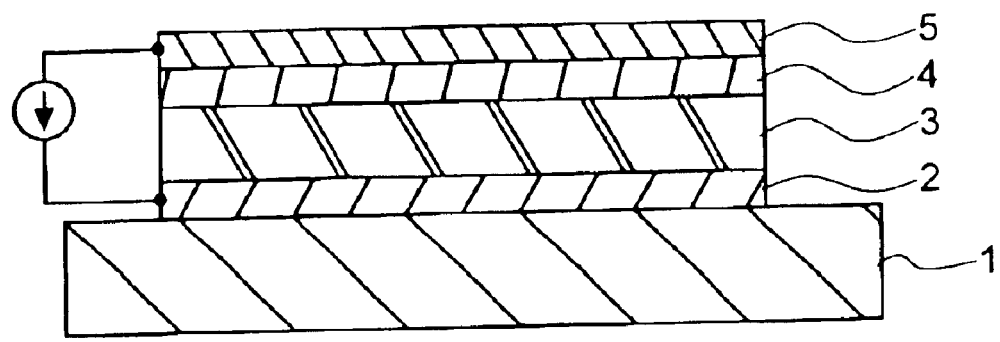
FIG. 1 is a schematic cross-sectional view of the basic construction of an organic EL device according to the first embodiment of the invention.

According to the first embodiment of the invention, the organic EL device has an anode 2 on a substrate 1 as shown in FIG. 1. Stacked on the anode 2 are an organic layer 3, typically a light emitting layer, an electron injecting layer 4, and a cathode 5. The organic layer 3 may be a single layer or consist of a plurality of layers. The order of stacking may be reversed. The stack construction may be any appropriate one depending on a particular display specification and manufacture process.

The electron injecting layer 4 close to the cathode 5 is an electron injecting organic layer containing an organic metal salt and/or organic metal complex of a metal having a standard electrode potential of more negative than −1.8 V at 25° C., and formed by coating. In this embodiment, an organic polymer layer containing a high molecular weight EL material is disposed close to the electron injecting organic layer.

The provision of such an electron injecting organic layer ensures a high electron injection efficiency even when an inexpensive stable metal material is used in the cathode, and eliminates a need for separately forming an electron injecting electrode or cathode of Ca or the like. The provision of such an electron injecting organic layer avoids the shortcomings of an electron injecting electrode generally formed of an unstable material, that is, prevents the electron injecting electrode material such as Ca from diffusing into the polymer to shorten the device life, or prevents the electron injecting electrode material from being oxidized to degrade the device performance. Additionally, since the electron injecting organic layer is formed by coating, it is compatible with a wide variety of metals other than the thermally reducible auxiliary electrode, and provides improved productivity, a sufficient coating thickness, and a sufficient electron injection efficiency.

Differently stated, the organic EL device has two or more organic layers including a light emitting layer disposed between a first electrode on a substrate and a second or counter electrode. At least one layer of the two or more organic layers is formed by coating. The organic layer disposed close to the first or second electrode which serves as the cathode is an electron injecting layer as defined just above.

Preferably, an anode is formed as the first electrode on the substrate, organic layers of multilayer structure including a high molecular weight organic layer and an electron injecting organic layer are formed thereon in order, and a cathode is formed as the second electrode on the electron injecting organic layer. In this embodiment wherein the high molecular weight organic layer is formed as a lower side organic layer and the electron injecting organic layer is formed as an upper side organic layer, the upper side organic layer can be readily formed by coating using a suitable solvent. Then the multilayer structure including the high molecular weight organic layer as a lower side organic layer can be readily obtained.

As noted in the preamble, JP-A 2000-182774 discloses that a mixed layer comprising an organic metal complex containing at least one alkali metal ion, alkaline earth metal ion or rare earth metal ion and an electron transporting organic compound is formed as the organic layer disposed close to a cathode electrode, and the cathode electrode is constructed from a metal capable of reducing the metal ion in the organic metal complex in the mixed layer into a metal in vacuum. More specifically, a mixed layer of tris(8-quinolinolato)aluminum complex and mono(8-quinolinolato)lithium complex is formed by evaporation. Examples of forming an organic layer by coating are disclosed nowhere. The materials of the cathode electrode are limited to high-melting metals. The layer disposed close to the mixed layer is a layer of tris(8-quinolinolato)aluminum complex. There are disclosed no examples of the multilayer structure including a high molecular weight EL material-containing layer nor examples of the electron injecting material suitable as the high molecular weight light-emitting material. It is taught nowhere to select a material in terms of a standard electrode potential.

In another embodiment of the organic EL device, a layer containing at least one salt selected from inorganic metal salts and organic metal salts of a metal having a standard electrode potential of from −1.8 V to −0.8 V at 25° C. is provided as the electron injecting layer.

The electron injecting layer containing a metal salt of a normally stable metal species has electron injecting and transporting capabilities, and a function of effectively injecting electrons from the cathode into the organic layer, modifies the interface between the cathode and the organic layer, and enables stable electron injection and light emission, leading to improved emission efficiency and a longer life. It eliminates a need for separately forming an electron injecting electrode or cathode of Ca or the like and avoids the shortcomings of an electron injecting electrode generally formed of an unstable material, that is, prevents the electron injecting electrode material such as Ca from diffusing into the polymer to shorten the device life, or prevents the electron injecting electrode material from being oxidized to degrade the device performance.

It is noted that the standard electrode potential is a potential at which the metal participating in electrode reaction in an aqueous solution at 25° C. becomes zero valent.

As mentioned above, the first embodiment is divided into one embodiment (i) wherein an electron injecting organic layer containing an organic metal salt and/or organic metal complex of a metal having a standard electrode potential of more negative than −1.8 V at 25° C. is formed by coating and the other embodiment (ii) wherein an electron injecting layer containing an inorganic metal salt and/or organic metal salt of a metal having a standard electrode potential from −1.8 V to −0.8 V at 25° C. is provided, which are separately described below by referring mainly to their organic layer construction.

Although the invention does not exclude the formation by coating of an electron injecting organic layer having the compound of embodiment (i) combined with the compound of embodiment (ii), most often an electron injecting layer of embodiment (i) or (ii) is selectively formed.

Embodiment (i) wherein an electron injecting organic layer containing an organic metal salt and/or organic metal complex of a metal having a standard electrode potential of more negative than −1.8 V at 25° C. is formed by coating The metals of the organic metal salts and organic metal complexes should have a standard electrode potential of more negative than −1.8 V at 25° C., preferably between −2.2 V and −3.1 V. The metals should preferably have a work function of up to 3.8 eV, but generally at least 1.95 eV.

Examples of suitable metals include alkali metals (I) such as Li, Na, K, Rb and Cs, alkaline earth metals (II) such as Mg, Ca, Sr and Ba, and rare earth metals (III) such as Y, La, Ce, Pr, Nd, Sm, Eu, Er and Yb. Of these, the alkali metals (I), alkaline earth metals (II) and Eu (III), Sm (III) and La (III) are preferred. Na (I), K (I), Cs (I), Li (I), Ca (II), Ba (II), Eu (III), Sm (III) and La (III) are more preferred. Na (I), K (I), Li (I), Ca (II), Ba (II), Eu (III), and Sm (III) are most preferred.

The organic metal complexes have organic ligands which coordinate with metals solely through coordinate bonds. Examples of the ligands that coordinate with metals in the organic metal complexes include β-diketones such as acetylacetone, 1,3-diphenyl-1,3-propanedione, 2,2,6,6-tetramethyl-3,5-heptanedione, 1,1,1,2,2,3,3-heptafluoro-7,7-dimethyl-4,6-octanedione, and 1-phenyl-1,3-butanedione; salicylaldehydes such as salicylaldehyde and diethylaminosalicylaldehyde; quinolinols such as 8-quinolinol; and phenanthrolines such as phenanthroline and bathophenanthroline.

Of these, preferred are complexes having coordinated those ligands which coordinate with the center metal with oxygen, such as β-diketones and salicylaldehydes, and especially ligands of the following formula (L-1). Where a plurality of ligands are present, at least one ligand may be the preferred ligand and desirably, all the ligands are the preferred ligands, especially the ligands of the formula (L-1).

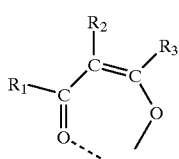

(L-1)

Herein the ligand is shown in the coordinated state. $R_1$, $R_2$ and $R_3$ are each independently hydrogen, an alkyl or aryl group, and $R_2$ and $R_3$ may bond together to form a ring.

The alkyl groups represented by $R_1$ to $R_3$ may be substituted or unsubstituted and preferably have 1 to 10 carbon atoms in total. They may be straight or branched. Among others, unsubstituted alkyl groups and perfluoroalkyl groups are preferred. Illustrative are methyl, ethyl, propyl, isopropyl, butyl, isobutyl, sec-butyl, tert-butyl and perfluoropropyl.

The aryl groups represented by $R_1$ to $R_3$ may be substituted or unsubstituted and preferably have 6 to 12 carbon atoms in total. They may be mono- or polycyclic. Among others, monocyclic unsubstituted aryl groups are preferred, with phenyl being typical.

The rings formed by $R_2$ and $R_3$ bonded together include aromatic and heterocyclic rings. Aromatic carbocyclic rings are preferred, with benzene rings being especially preferred. The benzene rings may be unsubstituted or substituted with an amino (e.g., diethylamino), nitro or cyano group.

Preferred combinations are those in which $R_1$ and $R_3$ are alkyl or aryl groups and $R_2$ is hydrogen, and those in which $R_1$ is hydrogen and $R_2$ and $R_3$, taken together, form a benzene ring. Namely, it is preferred that β-diketones and salcylaldehydes be ligands.

The organic metal salts are organic acids, alcohols and dialkylamides whose hydrogen is substituted with a metal. The partial presence of a coordinate bond between a metal and a ligand is acceptable, but those salts consisting solely of coordinate bonds are excluded. Illustrative examples include salts of organic acids such as carboxylic acids and phenols, and salts of alkoxides and dialkylamides.

The carboxylic acids may be either aliphatic or aromatic. Suitable aliphatic carboxylic acids have 1 to 24 carbon atoms in total, and may be saturated or unsaturated. They may have two or more carboxyl groups. They may have substituent groups such as aryl groups. Illustrative examples include aliphatic carboxylic acids such as acetic acid, propionic acid, octylic acid, isooctylic acid, decanoic acid and lauric acid; unsaturated aliphatic carboxylic acids such as oleic acid and ricinoleic acid; di-, tri- and polyfunctional carboxylic acids such as citric acid, malic acid and oxalic acid. Suitable aromatic carboxylic acids have 7 to 24 carbon atoms in total and may have substituent groups such as $C_{1-8}$ alkyl groups or hydroxyl groups. Illustrative examples include benzoic acid, o-(t-butyl)benzoic acid, m-(t-butyl)benzoic acid, salicylic acid, m-hydroxybenzoic acid, and p-hydroxybenzoic acid.

The phenols are preferably those having 6 to 46 carbon atoms in total, and may have substituent groups (e.g., straight or branched $C_{1-8}$ alkyl groups, and aryl groups such as phenyl) or fused rings (e.g., aromatic rings such as benzene rings which may have substituent groups). The phenols may be either monohydric or di- or polyhydric. Illustrative examples include phenol, naphthol, 4-phenylphenol, and 2,2-bis(p-hydroxyphenyl)propane (known as bisphenol A).

The alkoxides are formed from alcohols preferably having 1 to 10 carbon atoms in total, for example, primary alcohols such as ethyl alcohol, n-propyl alcohol and n-butyl alcohol, secondary alcohols such as isopropyl alcohol and s-butyl alcohol, and tertiary alcohols such as t-butyl alcohol. The alcohols may be dihydric or polyhydric, with ethylene glycol being a typical example.

The dialkylamides preferably have 2 to 24 carbon atoms in total and may further have substituent groups. Illustrative examples include dimethylamide, diethylamide, and N-methyl-N-ethylamide.

Of these organic metal salts, preferred are alkoxides, phenoxides and acetic acid salts.

The above-mentioned complexes and salts are used because they are highly stable and well dissolvable in coating solvents.

Illustrative, non-limiting examples of the organic metal salts and organic metal complexes are given below.

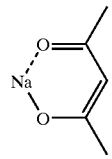

C-1

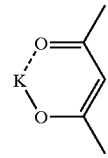

C-2

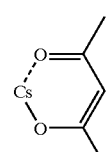

C-3

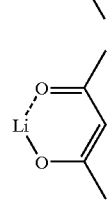

C-4

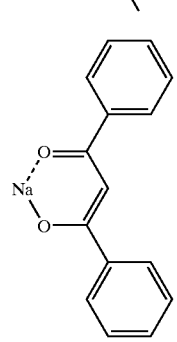

C-5

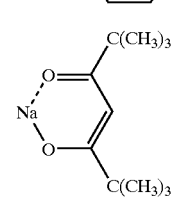

C-6

-continued

C-7
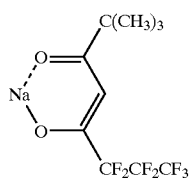

C-8
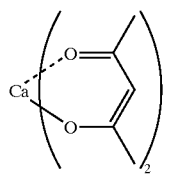

C-9
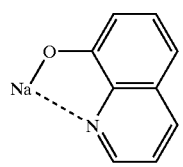

C-10
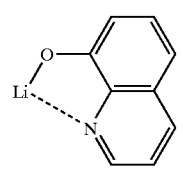

C-11
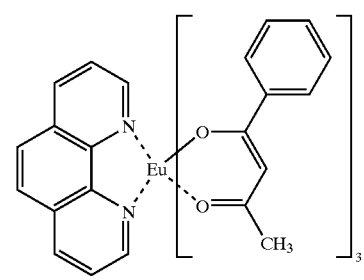

C-12
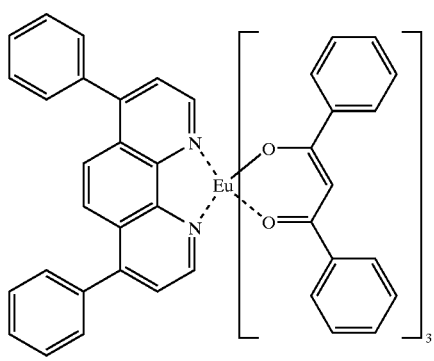

C-13
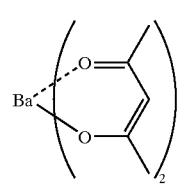

-continued

C-14
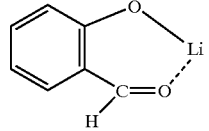

C-15
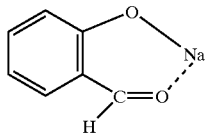

C-16
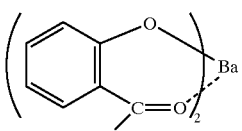

C-17
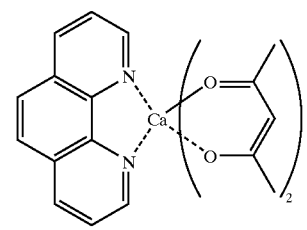

C-18
$[Ca(OC_2H_4O)]_n$  Mw = 2,000
(n = degree of polymerization)

C-19
$Ca(OC_2H_5)_2$

C-20
$Ca(CH_3COO)_2$

C-21
$Ca(OC_6H_5)_2$

C-22
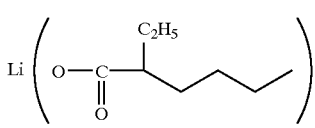  Mw = 2,000
(n = degree of polymerization)

C-23
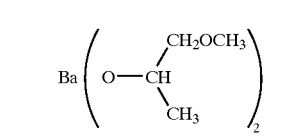

C-24

Ba(O—CH(CH2OCH3)(CH3))2

C-25
$Ba(CH_3COO)_2$

C-26
$Sm(i-C_3H_7O)_3$

C-27
$La(OC_2H_5)_3$

They may be used alone or in admixture of two or more. Preferably, the electron injecting organic layer disposed close to the cathode further contains an electron transporting material. The electron transporting materials are preferably compounds having an oxadiazole ring, triazole ring, quinoxaline ring, phenanthroline ring, quinolinol ring, thiadiazole ring or pyridine ring and compounds having a cyano group. An electron transporting material, especially a compound having an oxadiazole ring, triazole ring, quinoxaline ring, phenanthroline ring, quinolinol ring, thiadiazole ring, pyridine ring or cyano group is used because it has a high electron mobility and a high hole blocking ability sufficient to increase the emission efficiency of high molecular weight EL light emitting material. A coating of such electron transporting material is more amorphous so that the device life is prolonged. The compounds having an oxadiazole ring or quinolinol ring are especially preferred.

These compounds may be monomeric or polymeric. Useful compounds are shown below. Note that Mw is a weight average molecular weight and n is a degree of polymerization.

E-1
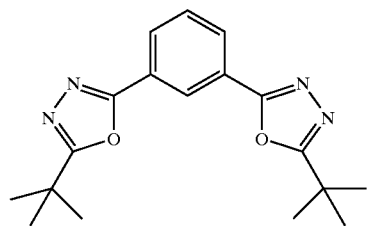

E-2
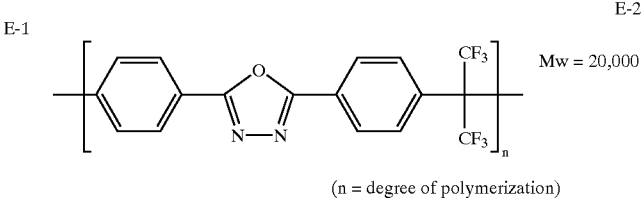

E-3
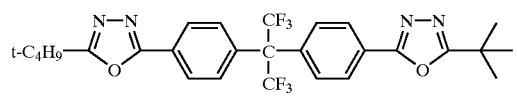

E-4
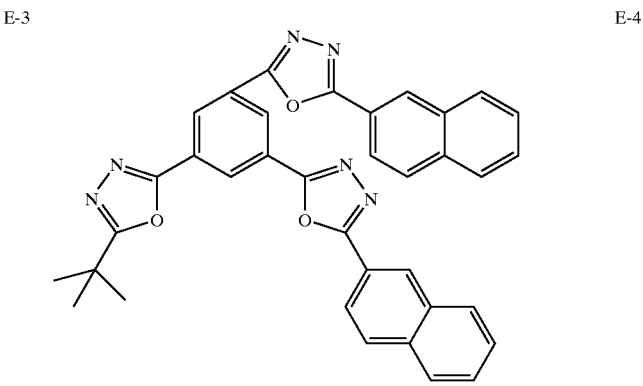

E-5
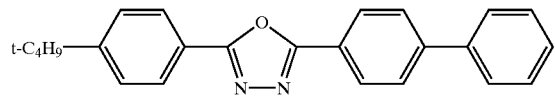

E-6
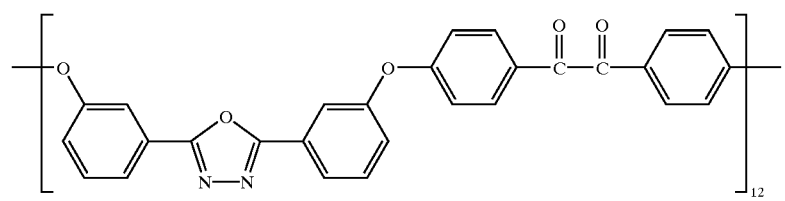

E-7
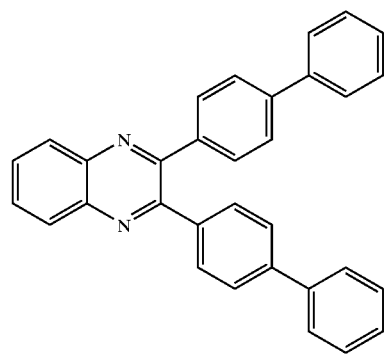

E-8
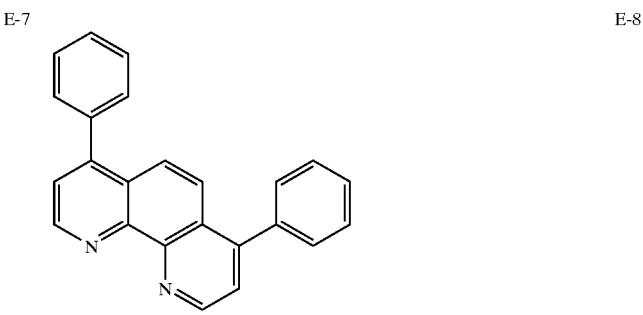

-continued
E-9
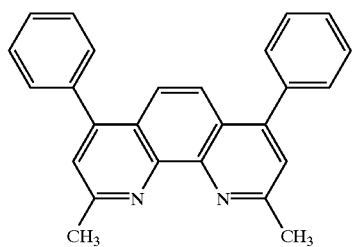
E-10
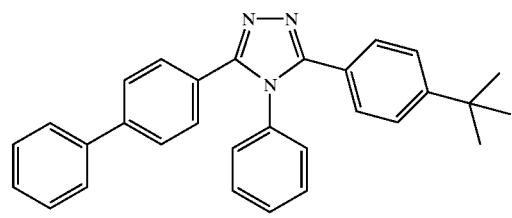
E-11
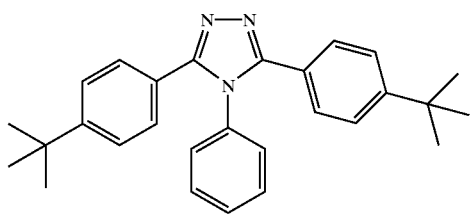
E-12
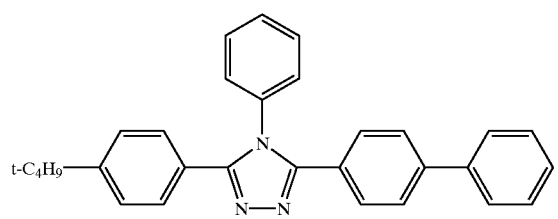
E-13
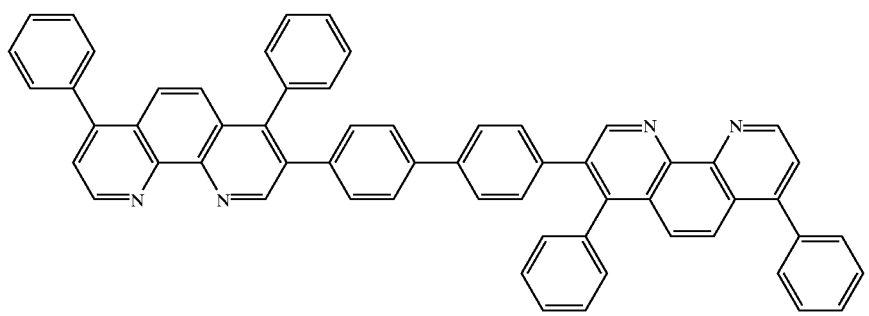
E-14
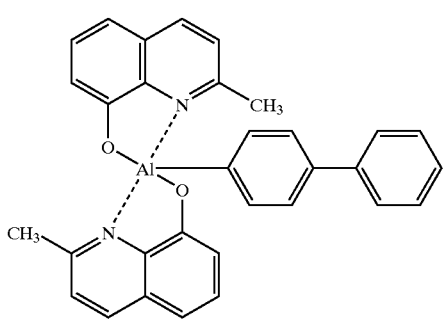
E-15
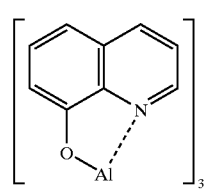
E-16
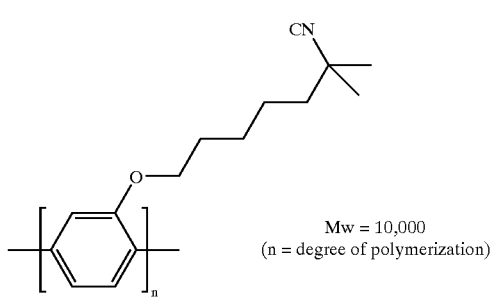
Mw = 10,000
(n = degree of polymerization)
E-17
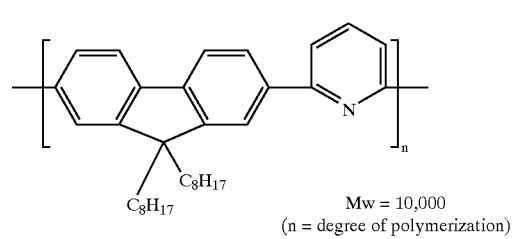
Mw = 10,000
(n = degree of polymerization)

E-18

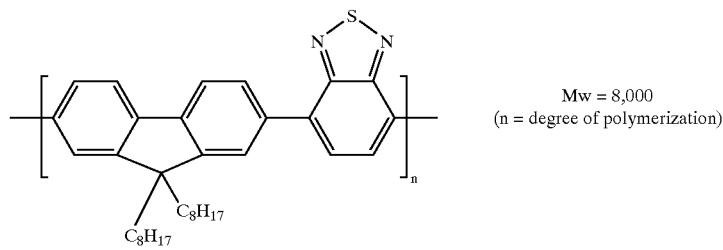

Mw = 8,000
(n = degree of polymerization)

These compounds may be used alone or in admixture of two or more.

In the electron injecting organic layer, an appropriate mixing ratio of the electron transporting material to the organic metal salt and/or organic metal complex is up to 99/1 on a molar basis. A lower proportion of the organic metal salt and/or organic metal complex leads to a lower electron injecting capability. The lower limit of the mixing ratio is 0. When the electron transporting material is used, the mixing ratio is usually in a range from 90/10 to 10/90 for a balance with conductivity. If necessary, a binder resin may be admixed.

In one preferred embodiment of the invention, the electron injecting organic layer has been crosslinked. It is preferably obtained by forming a coating containing a crosslinkable compound and causing the compound to be crosslinked.

The crosslinkable compound may be used as a structure capable of causing crosslinkage to the organic metal salt and/or organic metal complex and the electron transporting material. In general, it is preferred to use a crosslinkable resin or the like. Use of a crosslinkable resin renders a coating readily crosslinkable.

When the electron injecting organic layer is of crosslinked structure, the life of devices can be prolonged.

Suitable resins include modified silicone resins which are commercially available under the trade name of SR2101 from Dow Corning-Toray Silicone Co., Ltd.

In the electron injecting organic layer, an appropriate mixing ratio of the crosslinkable resin to the organic metal salt and/or organic metal complex is up to 70/30 on a weight basis. A higher proportion of the crosslinkable resin leads to a lower electron injecting capability. The lower limit of the mixing ratio is 0. When the crosslinkable resin is used, the mixing ratio is usually in a range from 50/50 to 1/99 for a balance with coating strength.

Crosslinkage is often achieved by cure treatment by drying or heating although cure conditions differ with a particular resin used. Drying is effected at room temperature, that is, a temperature of 15 to 35° C. for about 1 to 100 hours.

The electron injecting organic layer is formed by coating, preferably to a thickness in the range of 5 to 100 nm. Too thick a layer may have a lower emission efficiency whereas too thin a layer may lose an electron injecting capability.

For the electron injecting organic layer, one layer is generally provided although two or more layers may be provided wherein the total thickness falls within the above-defined range.

The high molecular weight organic layer disposed close to the electron injecting organic layer to form a multilayer structure together is an organic layer containing a high molecular weight EL material.

With respect to the molecular weight of the high molecular weight EL material, it preferably has a weight average molecular weight (Mw) of at least 5,000, and more preferably 5,000 to 3,000,000. Use of a material with such a molecular weight gives the layer a sufficient physical strength, resulting in devices free of leakage and having improved performance.

The high molecular weight EL material develops the function of an organic layer constituting an organic EL device. The high molecular weight EL material is selected as appropriate for a desired layer. In some cases, a functional material in the form of a low molecular weight compound is modified into a derivative capable of reaching a high molecular weight whereby a high molecular weight material is obtained from the derivative.

Suitable high molecular weight EL materials include polyfluorene and derivatives thereof, poly(p-phenylene vinylene) and derivatives thereof, poly(biphenylene vinylene) and derivatives thereof, poly(terphenylene vinylene) and derivatives thereof, poly(naphthylene vinylene) and derivatives thereof, poly(thienylene vinylene) and derivatives thereof, polythiophene and derivatives thereof, polyvinyl compounds, polyacrylate derivatives, and polymethacrylate derivatives.

Most often the high molecular weight EL material is preferably a high molecular weight component (inclusive of a hole injecting and transporting, light-emitting material) because the electron injecting organic layer is disposed close thereto. For this reason, polyvinyl compounds, polyacrylate derivatives, and polymethacrylate derivatives are preferably obtained by introducing a light emitting material into a monomer prior to polymerization to a high molecular weight. Of these, the polyvinyl compounds are obtained, for example, by introducing a vinyl group into a fused polycyclic compound (or a derivative thereof having introduced therein a substituent or the like) such as carbazole, anthracene, naphthacene, pyrene, tetracene, coronene, perylene, phthaloperylene or naphthaloperylene directly or via a linking group, and polymerizing the monomer to a high molecular weight.

Preferred high molecular weight light emitting materials are polyvinyl carbazole (PVK), poly(p-phenylene vinylene) derivatives (PPV derivatives) of the following formula (P-1), poly(aryl fluorene) derivatives of the following formula (P-2), and mixtures thereof.

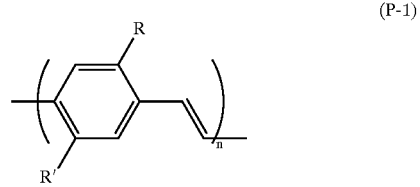

(P-1)

Herein R is 2-ethylhexyloxy, R' is methoxy, and n is a degree of polymerization. Mw is 50,000.

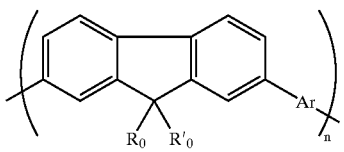

(P-2)

Herein $R_0$ and $R_0'$ are alkyl, Ar is an aromatic or heterocyclic group which may have a substituent group, and n is a degree of polymerization. Mw is 5,000 to 3,000,000.

Among others, π electron conjugated, high molecular weight, light emitting materials, for example, poly(aryl fluorene) derivatives are preferred.

The high molecular weight EL materials may be used alone or in admixture of two or more, or in combination with a low molecular weight compound. In order to provide a layer with a sufficient physical strength to prevent leakage, the high molecular weight EL material should preferably account for 20 to 100% by weight, more preferably 50 to 100% by weight of the layer.

Where the high molecular weight organic layer is a light emitting layer, any known light emitting material (excluding high molecular weight ones) may be used along with the high molecular weight light emitting material. Suitable light emitting materials include naphthalene derivatives, anthracene and derivatives thereof, perylene and derivatives thereof, polymethine, xanthene, coumarin and cyanine dyes, metal complexes of 8-hydroxyquinoline and derivatives, aromatic amines, tetraphenylcyclopentadiene and derivatives thereof, tetraphenylbutadiene and derivatives thereof, and iridium complexes. For example, the compounds described in, for example, JP-A 57-51781 and JP-A 59-194393 and other known compounds are useful.

The high molecular weight organic layer preferably has a thickness of 10 to 200 nm although the thickness varies with a particular method of forming the layer. Too thick a layer may lead to a lower emission efficiency whereas too thin a layer may be liable to leakage.

The high molecular weight organic layer may be a single layer or consist of a plurality of layers wherein the total thickness falls in the above-defined range.

In the organic EL device of the invention wherein an electron injecting organic layer is formed contiguous to the cathode by coating, and a high molecular weight organic layer is formed contiguous to the electron injecting organic layer, it is preferred that an anode be formed as a first electrode on a substrate, organic layers of multilayer structure in which the high molecular weight organic layer is a lower side organic layer and the electron injecting organic layer is an upper side organic layer be formed thereon, and the cathode be formed as a second electrode thereon.

In this embodiment, an organic layer may intervene between the lower side organic layer and the anode, if necessary. The intervening organic layer preferably contains a high molecular weight material. For example, a hole injecting layer is provided as a buffer layer adjoining the anode. Such a hole injecting layer may be formed from polyethylene dioxythiophene/polystyrene sulfonate (PEDOT/PSS), polyaniline/polystyrene sulfonate (Pani/PSS), metal phthalocyanine or the like. It may be formed by a solution coating method or by evaporation if evaporable.

The method of preparing an organic EL device according to the invention is described by referring to the preferred embodiments described above.

In such an embodiment, the high molecular weight EL material, especially high molecular weight light emitting material may be used in combination with a low molecular weight compound as previously described, although the high molecular weight EL material should preferably account for 20 to 100% by weight, more preferably 50 to 100% by weight of the layer. A lower proportion of high molecular weight component may invite a likelihood of leakage because in the step of coating an upper layer to form a multilayer structure, the lower layer is physically weak and can thus be attacked thereby. The low molecular weight compounds used herein have a molecular weight of less than 5,000, more often up to 2,000 and are generally monomers, although oligomers having a degree of polymerization of about 2 to about 20 are acceptable.

The method of forming the lower layer containing a high molecular weight EL material is not critical and any of vacuum evaporation, ionizing evaporation, and solution coating methods (e.g., spin coating, casting, dipping and spray coating) may be used. Of these, the solution coating methods are desirable for improved productivity.

In the method of forming the lower layer containing a high molecular weight EL material by coating, the coating solvent is not critical as long as the high molecular weight EL material is dissolvable therein. Use is often made of organic solvents including aromatic solvents such as toluene and xylene, halogenated solvents such as 1,2-dichloroethane and 1,2,3-trichloropropane, and heterocyclic solvents such as tetrahydrofuran (THF). For the coating, a solution having a concentration of 0.1 to 5% by weight may be used.

It is noted that the coating of the upper layer may be carried out on the lower layer after the lower layer is annealed or directly without annealing.

The upper layer used in combination with the lower layer is formed by coating. The coating solvent used to this end is preferably selected from among (i) a chain compound of 3 to 6 carbon atoms in total, having on the molecule at least one alkoxy group of 1 to 3 carbon atoms, carbonyl group, or ester group of 2 to 3 carbon atoms, and a hydroxyl group at the α- and/or β-position thereto, preferably at the α- or β-position, (ii) a chain compound of 3 to 6 carbon atoms in total, having on the molecule a dialkylamide group of 2 to 4 carbon atoms, (iii) an ester form of chain compound having 5 to 8 carbon atoms in total, and (iv) a carbonate form of chain compound having 4 to 7 carbon atoms in total, or a mixture of any.

The polar solvents described herein are unlikely to attack the organic EL material and are thus suited as the coating solvent for building up layers. The resulting film is found to contain no crystal grains upon microscope observation and to be amorphous by x-ray diffraction analysis. The amorphous film when assembled into a device has the advantage of a long lifetime due to minimized leakage and restrained function degradation. With respect to the compounds (i) and (ii), if the total number of carbon atoms is less than 3, a coating may dry too rapidly, failing to control the thickness of the organic layer to be uniform. With respect to the compounds (i) and (ii), if the total number of carbon atoms is more than 7, a coating may dry too slowly and have too high a viscosity, failing to control the thickness of the organic layer to be uniform. The total number of carbon atoms in the compounds (iii) and (iv) is limited for the same reason. In the case of saturated alcohols, a less number of carbon atoms may lead to a higher drying rate, undesirably inviting precipitation of the organic EL material and failing to form a coating. Too large a number of carbon atoms may slow the drying rate and lead to a lower solubility so that the organic EL material may not be dissolved. Aromatic and halogenated compounds are undesired in that most organic EL materials are dissolvable therein, and they can attack the underlying layer, causing leakage. Highly volatile esters such as ethyl acetate are difficult to form an amorphous coating because of too high a drying rate. Heterocyclic solvents such as THF can attack the underlying layer, causing leakage.

Examples of suitable organic solvents include 2-methoxyethanol, 2-ethoxyethanol, isopropyl cellosolve, methyl lactate, ethyl lactate, acetoin, diacetone alcohol, 4-hydroxybutanone, propioin, 2-hydroxy-2-methyl-3-butanone, dimethylformamide, dimethylacetamide, propyl acetate, butyl acetate, sec-butyl acetate, tert-butyl acetate, pentyl acetate, 2-methylbutyl acetate, 3-methylbutyl acetate, hexyl acetate, butyl formate, isobutyl formate, pentyl formate, isopentyl formate, hexyl formate, heptyl formate, ethyl butyrate, ethyl isobutyrate, propyl butyrate, isopropyl butyrate, propyl propionic acid, butyl propionic acid, tert-butyl propionic acid, sec-butyl propionic acid, methyl valerate, methyl isovalerate, ethyl valerate, ethyl isovalerate, ethyl methyl carbonate, diethyl carbonate, and dipropyl carbonate.

In forming the upper side organic layer, the electron transporting material, organic metal complex and the like are preferably dissolved in the coating solvent mentioned above in a total concentration of 0.1 to 5% by weight. For the coating, solution coating methods such as spin coating, spray coating and dip coating may be used. After the coating, the coated structure may be heated on a hot plate or the like for drying off the solvent. The drying is preferably carried out in a partial vacuum or in an inert atmosphere by heating at a temperature in the range of about 50 to 280° C.

The preferred combination of organic layers used to construct the multilayer structure including upper and lower side layers is a combination of a lower layer which is a light emitting layer containing a polymeric hole injecting and/or transporting component with an upper layer which is an electron injecting organic layer, preferably formed using a specific coating solvent, as described above. Therefore, the organic EL device of the invention preferably has an anode on the substrate as the first electrode and a cathode on the organic layers as the second electrode, as described above. This construction may further include a hole injecting and/or transporting layer between the anode and the polymeric lower layer (especially light emitting layer), as described above. This layer is preferably a polymeric layer containing a high molecular weight material when the upper layer is formed by coating.

As long as the organic EL device of the invention has an electron injecting organic layer disposed close to the cathode and a high molecular weight organic layer disposed close to the electron injecting organic layer, it is acceptable that the first electrode be a cathode and the second electrode be an anode, and the construction of organic layers may be selected from a variety of compositions and is not critical.

Although the thickness of the organic layers is in part previously described, the thickness of a single layer is preferably about 0.5 to 1,000 nm, more preferably about 10 to 500 nm when it is formed by coating methods, and about 1 to 500 nm when it is formed by evaporation methods such as vacuum evaporation.

Embodiment (ii) having an electron injecting layer containing an inorganic metal salt and/or organic metal salt of a metal having a standard electrode potential from −1.8 V to −0.8 V at 25° C.

The metals of the inorganic and organic metal salts should have a standard electrode potential at 25° C. between −1.8 V and −0.8 V, and preferably between −1.7 V and −1.15 V. The metals should preferably have a work function of at least 4.0 eV, but generally up to about 6 eV.

Examples of suitable metals include Al (III), Mn (II), Zr (IV), Ti (II), Hf (IV), Ta (V), Nb (III) and V (II). Preferred metals are Al (III), Mn (II) and Zr (IV), with Al (III) and Mn (II) being more preferred. Al (III) is most preferred.

As used herein, the inorganic metal salts include inorganic acids whose hydrogen is substituted with a metal, for example, metal halides such as chlorides, fluorides, bromides and iodides.

The organic metal salts include organic acids, alcohols and dialkylamides whose hydrogen is substituted with a metal, for example, salts of organic acids such as carboxylic acids and phenols, and salts of alkoxides and dialkylamides.

The carboxylic acids may be either aliphatic or aromatic. Suitable aliphatic carboxylic acids have 1 to 24 carbon atoms in total, and may be saturated or unsaturated. They may have two or more carboxyl groups. They may have substituent groups such as aryl groups. Illustrative examples include aliphatic carboxylic acids such as acetic acid, propionic acid, octylic acid, isooctylic acid, decanoic acid and lauric acid; unsaturated aliphatic carboxylic acids such as oleic acid and ricinoleic acid; di-, tri- and polyfunctional carboxylic acids such as citric acid, malic acid and oxalic acid. Suitable aromatic carboxylic acids have 7 to 24 carbon atoms in total and may have substituent groups such as $C_{1-8}$ alkyl groups or hydroxyl groups. Illustrative examples include benzoic acid, o-(t-butyl)benzoic acid, m-(t-butyl) benzoic acid, salicylic acid, m-hydroxybenzoic acid, and p-hydroxybenzoic acid.

The phenols are preferably those having 6 to 46 carbon atoms in total, and may have substituent groups (e.g., straight or branched $C_{1-8}$ alkyl groups, and aryl groups such as phenyl) or fused rings (e.g., aromatic rings such as benzene rings which may have substituent groups). The phenols may be either monohydric or di- or polyhydric. Illustrative examples include phenol, naphthol, 4-phenylphenol, and 2,2-bis(p-hydroxyphenyl)propane (known as bisphenol A).

The alkoxides are formed from alcohols preferably having 1 to 10 carbon atoms in total, for example, primary alcohols such as ethyl alcohol, n-propyl alcohol and n-butyl alcohol, secondary alcohols such as isopropyl alcohol and s-butyl alcohol, and tertiary alcohols such as t-butyl alcohol. The alcohols may be dihydric or polyhydric, with ethylene glycol being a typical example.

The dialkylamides preferably have 2 to 24 carbon atoms in total and may further have substituent groups. Illustrative examples include dimethylamide, diethylamide, and N-methyl-N-ethylamide.

Of these organic metal salts, preferred are alkoxides, phenoxides and acetic acid salts. Alkoxides are most preferred.

These metal salts are used because they are highly stable and allow for efficient electron injection.

Illustrative, non-limiting examples of the metal salts are given below.

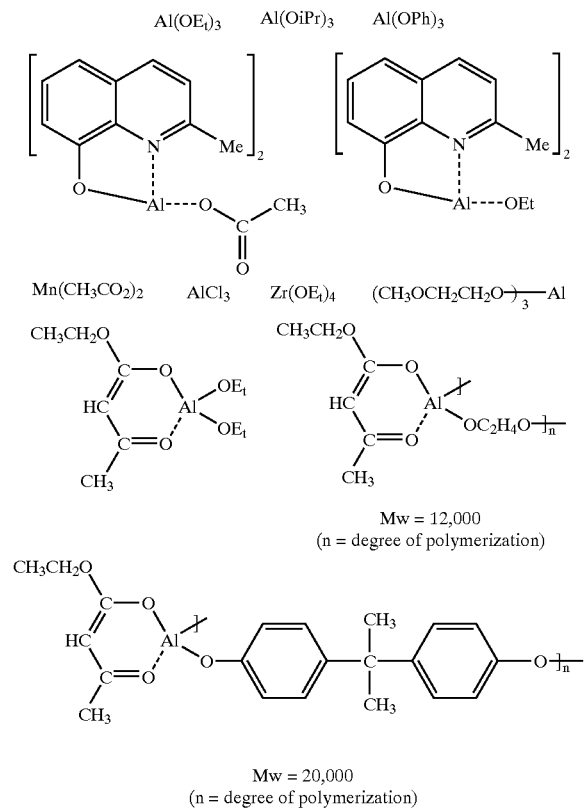

They may be used alone or in admixture of two or more.

The electron injecting layer containing the metal salt preferably consists of the metal salt although the metal salt may be admixed with an electron transporting material such as tris(8-quinolinolato)aluminum complex (Alq3). The content of the metal salt in the electron injecting layer is preferably at least 10% by weight, and more preferably at least 50% by weight.

The electron injecting layer preferably has a thickness of about 1 to 100 nm, more preferably about 1 to 30 nm because electron injection efficiency lowers when it is too thin or too thick.

The electron injecting layer may be formed by any desired thin film forming method, for example, evaporation, sputtering, and even spin coating if a thin film can be formed by solution coating.

The method of forming organic layers in the organic EL device may be any desired thin film forming method, for example, evaporation or sputtering. If a thin film can be formed by solution coating, use may be made of spin coating, spray coating, casting, and ink jet coating methods. The organic layer formed by a coating method is described below.

The preferred coating method is spin coating. Since the spin coating is by applying a solution over the entire surface of a substrate, the step of forming the organic layer is very simple and a simple and inexpensive apparatus can be used.

The organic material used to form the organic layer in this embodiment may be selected from light emitting materials and charge transporting materials (generally so designated as encompassing both electron and hole transporting materials) commonly used in organic EL devices. Of these, those organic materials which are dissolvable in solvents are preferred.

The organic layers may include, for example, a light emitting layer using a highly soluble, high molecular weight light emitting material, a mixed light emitting layer comprising a high molecular weight light emitting material and a charge transporting material, and optionally, an electron injecting and transporting layer containing an electron injecting and transporting material between the light emitting layer and the aforementioned electron injecting layer, or a hole injecting and transporting layer containing a hole injecting and transporting material between the light emitting layer and the hole injecting electrode. It is also acceptable to include a high resistance electron injecting and transporting layer or hole injecting and transporting layer formed of an inorganic material, instead of the electron injecting and transporting layer or the hole injecting and transporting layer.

The light emitting layer may be a single layer or consist of two or more layers. There may be formed a plurality of layers including a light emitting layer and a charge transporting layer. In addition to the high molecular weight light emitting material, the light emitting layer may contain a light emitting material other than the high molecular weight one and a charge transporting material. Alternatively, the high molecular weight light emitting material and/or charge transporting material may be dispersed in a high molecular weight compound.

Examples of the high molecular weight EL materials such as high molecular weight light emitting materials and the light emitting materials other than the high molecular weight ones are as described in embodiment (i) and their usage is also the same. In this embodiment, a light emitting layer consisting of a light emitting material other than the high molecular weight one may be formed by a dry process such as evaporation, since it is not essential to use a high molecular weight EL material as the layer disposed adjacent to the electron injecting layer and remote from the cathode.

The charge transporting material used herein is not critical and may be selected from a variety of electron transporting materials and hole transporting materials. Suitable hole transporting materials include pyrazoline derivatives, arylamine derivatives, stilbene derivatives, and triphenyldiamine derivatives.

Suitable electron transporting materials include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorene and derivatives thereof, diphenyldicyanoethylene and derivatives thereof, diphenoquinone derivatives, 8-hydroxyquinoline and derivatives thereof, and metal complexes thereof. Illustrative examples are described in JP-A 63-70257, JP-A 63-175860, JP-A 2-135359, JP-A 2-135361, JP-A 2-209988, JP-A 3-37992, and JP-A 3-152184.

The preferred hole transporting material is 4,4-bis(N-(3-methylphenyl)-N-phenylamino)biphenyl, and the preferred electron transporting materials are 2-(4-biphenylyl)-5-(4-t-butylphenyl)-1,3,4-oxadiazole, benzoquinone, anthraquinone and tris(8-quinolinolato)aluminum.

Of these, either one of the electron transporting compound and the hole transporting compound may be used or both may be used at the same time. These compounds may be used alone or in admixture.

The amount of the charge transporting material used varies with the type of compound used and may be determined as optimum insofar as it does not compromise the film forming ability and light emission capability. Usually the amount of the charge transporting material is 1 to 40% by weight, preferably 2 to 30% by weight based on the light emitting material.

When the high molecular weight light emitting material is used, the light emitting layer generally has a thickness of 0.5 nm to 10 µm, preferably 1 nm to 1 µm. For increasing the current density and emission efficiency, a thickness in the range of 10 to 500 nm is preferred. When a thin film is formed by a coating method, the coating is preferably dried in a partial vacuum or in an inert atmosphere by heating at a temperature of about 30 to 200° C., preferably about 60 to 100° C. for removing the solvent.

In the event where the charge transporting layer is formed below the light emitting layer, the charge transporting layer must be heat resistant to some extent if the formation of the light emitting layer involves a heat polymerization step. In this event, a compound having a glass transition temperature of at least 200° C., more preferably at least 300° C., especially at least 350° C. is preferred for the charge transporting layer.

The thickness of the organic hole injecting and transporting layer and electron injecting and transporting layer is not critical and varies with a particular forming method. The thickness is generally about 5 to 500 nm, and especially about 10 to 300 nm. When the hole injecting and transporting layer is divided into an injecting layer and a transporting layer, it is preferred that the injecting layer have a thickness of at least 1 nm and the transporting layer have a thickness of at least 1 nm. The upper limit of thickness is generally about 500 nm for the injecting layer and about 500 nm for the transporting layer.

The solvent used in forming the organic layer by the coating method is not critical as long as the organic material is dissolvable therein and no troubles occur upon coating. Exemplary solvents include alcohol, hydrocarbon, ketone, and ether solvents which are commonly used in this type of application. Among others, chloroform, methylene chloride, dichloroethane, tetrahydrofuran, toluene and xylene are preferred. The light emitting material is generally dissolved in such a solvent in a concentration of at least 0.1% by weight although the concentration depends on the structure and molecular weight of the light emitting material.

When it is desired to provide a definite interface between two organic layers, the surface of the lower layer on which the upper layer is to be coated may not be dried before the coating of the upper layer if the lower layer is formed by spin coating. After the lower layer is coated, it may be heat treated if drying is necessary.

When no definite interface is formed between two organic layers, these two layers may be formed such that the boundary therebetween may have a graded composition. By using two solutions which differ in at least one of solvent solubility, solvent, viscosity and specific gravity, two organic layers can be coated separately or such that the interfacial composition changes in grade. The formation of an interface can also be avoided by coating two layers in such a manner that the subsequent layer is coated before the receptive surface of the lower layer has been dried. It is preferred that the main components or dopants in the two layers be mixed in a weight ratio from about 1000:1 to about 10:1 in adjacent regions of the two layers defining an interface.

The organic layer formed by the coating method preferably has a thickness of about 0.5 to 1000 nm, more preferably about 10 to 500 nm per layer. The organic layer which can be formed by one coating step generally has a thickness of about 0.5 to 1000 nm, more preferably about 10 to 500 nm. When the organic layer is made thick, especially at least 50 nm thick, the occurrence of current leakage is inhibited.

The embodiment (ii) having an electron injecting layer containing a specific inorganic or organic metal salt has been described. In a preferred construction, the electron injecting layer is an organic layer containing the organic metal salt and a layer disposed close thereto (remote from the cathode) contains a high molecular weight EL material. It is also preferred that the construction of organic layers other than the electron injecting organic layer be the same as the organic layer construction in embodiment (i).

Since the electron injecting organic layer of the above-described embodiment (i) or (ii), typically the electron injecting organic layer formed by a solution coating method is disposed close to the cathode, the invention does not require for the cathode to have a low work function and an electron injecting capability. Then the cathode need not be restricted to thermally reducible metals, and any of conventional metals may be used. For conductivity and ease of handling, a choice is preferably made among Al, Ag, In, Ti, Cu, Au, Mo, W, Pt, Pd and Ni, and mixtures thereof, and especially among Al and Ag. The cathode may be provided as a thin film having at least a thickness sufficient to provide electrons to the electron injecting and transporting layer or the like, typically at least 50 nm, preferably at least 100 nm. The upper limit of thickness is not critical although the film thickness is generally from about 50 nm to about 500 nm. Although the prior art required an electron injecting electrode made of a single metal element such as K, Li, Na, Cs, Mg, La, Ce, Ca, Sr, Ba, Sn, Zn or Zr or an alloy of two or three of the foregoing elements, the present invention eliminates a need for the electron injecting electrode.

The material of which the anode or hole injecting electrode is made is preferably a material capable of effectively injecting holes into the hole injecting and transporting layer or the like and having a work function of 4.5 to 5.5 eV. For example, materials based on tin-doped indium oxide (ITO), zinc-doped indium oxide (IZO), indium oxide ($In_2O_3$), tin oxide ($SnO_2$) or zinc oxide (ZnO) are preferable. These oxides may deviate somewhat from their stoichiometry. For ITO, an appropriate proportion of $SnO_2$ mixed with $In_2O_3$ is 1 to 20%, more preferably 5 to 12% by weight. For IZO, an appropriate proportion of ZnO mixed with $In_2O_3$ is about 12 to 32% by weight. For adjusting the work function of the hole injecting electrode, silicon oxide ($SiO_2$) may be incorporated therein. The preferred content of silicon oxide in ITO is about 0.5 to 10 mol % of $SiO_2$. The ITO having $SiO_2$ added thereto has an increased work function.

Not only the hole injecting electrode, but the electrode on the light output side should preferably have a light transmittance of at least 50%, more preferably at least 80%, especially at least 90% in the light emission band, typically from 400 to 700 nm, and especially at each light emission. With a lower transmittance, the light emitted by the light emitting layer would be attenuated through the electrode, failing to provide a luminance necessary as a light emitting device.

The hole injecting electrode preferably has a thickness of 50 to 500 nm, especially 50 to 300 nm. Although the upper limit of the electrode thickness is not critical, a too thick electrode would invite a lowering of transmittance and the risk of separation. Too thin an electrode would be less effective and have a problem associated with film strength during fabrication.

Most often, the electrode is formed by an evaporation method. When the organic layers are formed by a coating method, it is preferred to form the cathode by a coating method. This is because all the high molecular weight organic layer, electron injecting organic layer and cathode can then be formed by coating, which is advantageous in view of productivity due to possible formation of films over larger areas. When the cathode is formed by a coating method, use of an Ag paste or Ni paste is recommended. The cathode formed in this way preferably has a thickness of at least 500 nm. The upper limit of thickness is not critical although the cathode thickness is usually up to about 1000 nm.

Second Embodiment

The organic EL device according to the second embodiment of the invention has, in order, a substrate, a first electrode on the substrate, two or more stacked organic layers on the first electrode including a light emitting layer, and a second electrode on the organic layers. At least one layer of the two or more stacked organic layers other than the light emitting layer contains at least one high or low molecular weight compound selected from among oxadiazole, triazole, thiadiazole, quinoline, quinoxaline, phenanthroline, and derivatives thereof. The light emitting layer contains a π-conjugated polymer, polyvinyl compound, polyacrylate, polymethacrylate or a derivative thereof. These organic layers are formed by coating.

Light emission takes place at a very high efficiency when the light emitting layer contains at least one of π-conjugated polymers, polyvinyl compounds, polyacrylate, polymethacrylate and derivatives thereof, and at least one organic layer other than the light emitting layer, preferably the electron injecting and transporting layer contains at least one high or low molecular weight compound selected from among oxadiazole, triazole, thiadiazole, quinoline, quinoxaline, phenanthroline, and derivatives thereof. There are obtained devices having a high luminance and a long life.

First, reference is made to the organic layer serving as the light emitting layer. The organic layer on the light emitting layer side contains at least one of π-conjugated polymers, polyvinyl compounds, polyacrylate, polymethacrylate and derivatives thereof.

With respect to the molecular weight of the high molecular weight EL material, it preferably has a weight average molecular weight (Mw) of at least 5,000, and more preferably 5,000 to 500,000. Use of a material with such a molecular weight gives the layer a sufficient physical strength, resulting in devices free of leakage and having improved performance.

The high molecular weight EL material develops the function of an organic layer constituting an organic EL device. The high molecular weight EL material is selected as appropriate for a desired layer. In some cases, a functional material in the form of a low molecular weight compound is modified into a derivative capable of reaching a high molecular weight whereby a high molecular weight material is obtained from the derivative.

The π-conjugated polymers are polymers of the structure having alternately arranged double bonds and single bonds. Preferred examples include polymers having aromatic rings or hetero-aromatic rings such as benzene rings, naphthalene rings, thiophene rings, pyrrole rings or furan rings, which may have substituents, connected directly or via vinylene groups which may have substituents.

Suitable high molecular weight EL materials include polyfluorene and derivatives thereof, poly(p-phenylene vinylene) and derivatives thereof, poly(biphenylene vinylene) and derivatives thereof, poly(terphenylene vinylene) and derivatives thereof, poly(naphthylene vinylene) and derivatives thereof, poly(thienylene vinylene) and derivatives thereof, polythiophene and derivatives thereof, polyvinyl compounds, polyacrylate derivatives, and polymethacrylate derivatives. Of these, the polyvinyl compounds are obtained, for example, by introducing a vinyl group into a fused polycyclic compound (or a derivative thereof having introduced therein a substituent or the like) such as carbazole, anthracene, naphthacene, pyrene, tetracene, coronene, perylene, phthaloperylene or naphthaloperylene directly or via a linking group, and polymerizing the monomer to a high molecular weight.

Typical polymers are conjugated polymers whose backbone has recurring structures having a saturated (single) bond of carbon atoms followed by an unsaturated (double or triple) bond of carbon atoms, examples of which include poly(p-phenylene vinylene) (abbreviated as PPV) and derivatives thereof such as poly(2-methoxy-5-(2'-ethylhexyloxy)-p-phenylene vinylene),
poly(2,5-dioctyloxy-p-phenylene vinylene),
poly(2,5-dinonyloxy-p-phenylene vinylene),
poly(2,5-didecyloxy-p-phenylene vinylene),
poly(2,5-dipentyl-p-phenylene vinylene),
poly(2,5-dipentyl-m-phenylene vinylene),
poly(2,5-dioctyl-p-phenylene vinylene),
poly(2,5-dihexyloxy-p-phenylene vinylene),
poly(2,5-dihexyloxy-m-phenylene vinylene),
poly(2,5-dihexylthio-p-phenylene vinylene),
poly(2,5-didecyloxy-p-phenylene vinylene), and
poly(2-methoxy-5-hexyloxy-p-phenylene vinylene);

polythiophene and derivatives thereof such as poly(3-hexylthiophene),
poly(3-heptylthiophene),
poly(3-octylthiophene),
poly(3-nonylthiophene),
poly(3-decylthiophene),
poly(3-undecylthiophene),
poly(3-dodecylthiophene), and
poly[3-(p-dodecylphenyl)thiophene];

polyfluorene and derivatives thereof such as poly(9,9-dihexylfluorene),
poly(9,9-diheptylfluorene),
poly(9,9-dioctylfluorene),
poly(9,9-didecylfluorene),
poly[9,9-bis(p-hexylphenyl)fluorene],
poly[9,9-bis(p-heptylphenyl)fluorene], and
poly[9,9-bis(p-octylphenyl)fluorene]; and polyacetylene derivatives such as poly(1,2-diphenylacetylene),
poly[1-phenyl-2-(p-butylphenyl)acetylene],
poly(1-methyl-2-phenylacetylene),
poly(1-ethyl-2-phenylacetylene),
poly(1-hexyl-2-phenylacetylene), and
poly(phenylacetylene).

These polymers may be homopolymers or copolymers as enumerated above.

Also useful are polymers having in their molecular structure fluorescent dyes in the form of low molecular weight compounds to be described later, and materials having the above-mentioned polymers and fluorescent dyes dispersed in insulating polymers including polyvinyl compounds such as poly(N-vinylcarbazole) (abbreviated as PVK), and poly(methyl methacrylate) (abbreviated as PMMA), polycarbonate, polystyrene, poly(methylphenylsilane), and poly(diphenylsilane).

Of the foregoing polymers, the polyfluorene and derivatives thereof, which are π-conjugated polymers, are preferred.

These high molecular weight EL materials may be used alone or in admixture of two or more as long as the mixture does not compromise the desired function of an organic layer.

The high molecular weight EL material may be used in combination with a low molecular weight compound although the content of the high molecular weight EL material is preferably 20 to 100% by weight, more preferably 50 to 100% by weight of the entire layer. With a lower content of the high molecular weight EL material, this lower layer is physically weak and attacked during the step of coating an upper layer to form a multilayer structure, resulting in frequent leaks.

The low molecular weight compounds used herein have a molecular weight of less than 5,000, more often up to 2,000. They are generally monomers, although oligomers having a degree of polymerization of about 2 to about 20 are acceptable.

The low molecular weight compounds used herein are not critical and use may be made of various organic materials used in conventional organic EL devices. Illustrative are fluorescent dyes and derivatives thereof including tris(8-hydroxyquinolinolato)aluminum (abbreviated as Alq3), coumarin 6 or 3-(2-benzothiazolyl)-7-(diethylamino)coumarin, coumarin 7 or 3-(2-benzoimidazolyl)-7-(diethylamino)coumarin, 4-(dicyanomethylene)-2-methyl-6-(4-dimethylaminostyryl)-4H-pyran (abbreviated as DCM), Nile Red, 1,1,4,4-tetraphenyl-1,3-butadiene, N,N'-dimethylquinacridone (abbreviated as DMQA), 1,2,3,4,5-pentaphenylcyclopentadiene (abbreviated as PPCP), p-terphenyl, p-quarterphenyl, anthracene, and tetracene.

Illustrative examples of the preferred compounds which can be used in the light emitting layer are given below as D1 to D6. Mw is a weight average molecular weight and n is a degree of polymerization. These compounds may be used in admixture of two or more, if necessary for a carrier balance.

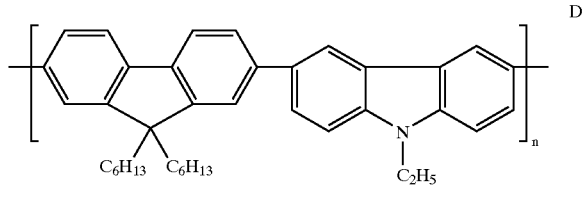

D-1

Mw = 100,000

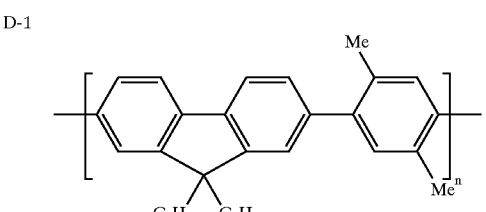

D-2

Mw = 100,000

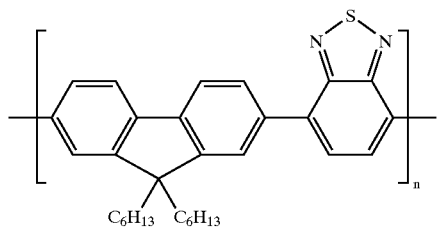

D-3

Mw = 300,000

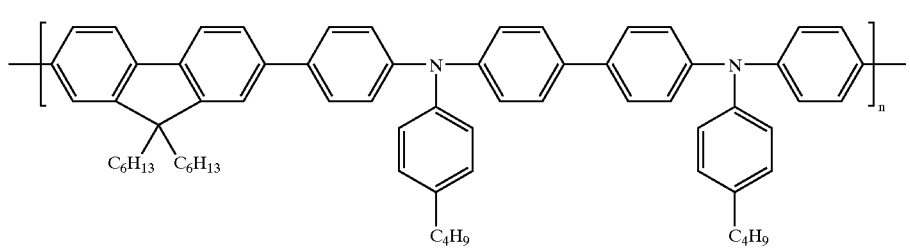

D-4

Mw = 100,000

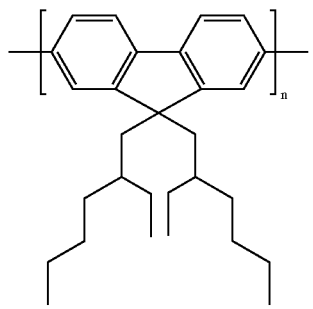

Mw = 200,000

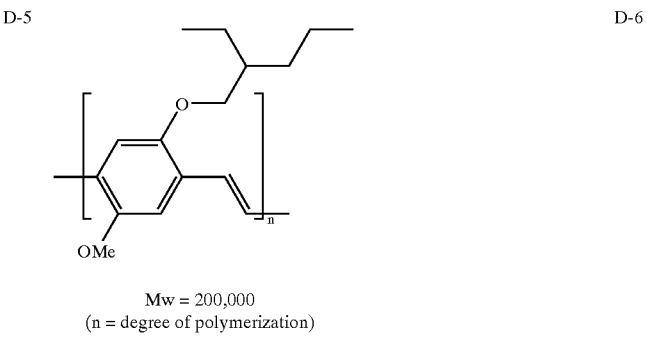

Mw = 200,000
(n = degree of polymerization)

The method of forming the light emitting layer containing a high molecular weight EL material is not critical and any of vacuum evaporation, ionizing evaporation, and solution coating methods (e.g., spin coating, casting, dipping and spray coating) may be used. Of these, the solution coating methods are desirable for improved productivity.

In the method of forming the light emitting layer containing a high molecular weight EL material by coating, the coating solvent is not critical as long as the high molecular weight EL material is dissolvable therein. Use is often made of organic solvents including aromatic solvents such as toluene and xylene, halogenated solvents such as 1,2-dichloroethane and 1,2,3-trichloropropane, and heterocyclic solvents such as tetrahydrofuran (THF). For the coating, a solution having a concentration of 0.1 to 5% by weight may be used.

At least one layer other than the light emitting layer contains at least one compound selected from among oxadiazole, triazole, thiadiazole, quinoline, quinoxaline, phenanthroline, and derivatives thereof, that is, a low or high molecular weight organic material. By combining the low or high molecular weight organic material with the π-conjugated high molecular weight material to be contained in the light emitting layer, light emission at a very high efficiency is enabled.

The low or high molecular weight organic materials preferably possess an electron injecting and transporting capability. The electron transporting material should have a high electron affinity and an increased electron mobility. Examples of the compounds having an electron transporting function include 2-(4-biphenyl)-5-(4-tert-butylphenyl)-1,3,4-oxadiazole (PBD), 2,5-bis(1-naphthyl)-1,3,4-oxadiazole (BND),
1,3-bis[5-(4-tert-butylphenyl)-1,3,4-oxadiazole]benzene (BPOB),
1,3,5-tris[5-(4-tert-butylphenyl)-1,3,4-oxadiazole]benzene (TPOB),
1,3,5-tris[5-(1-naphthyl)-1,3,4-oxadiazole]benzene (TNOB),
2,5-bis(1-phenyl)-1,3,4-oxadiazole,
dimethyl-1,4-bis(4-methyl-5-phenyl-2-oxazoyl)benzene (dimethyl POPOP),
2,5-bis(1-phenyl)-1,3,4-thiazole,
2,5-bis(1-phenyl)-1,3,4-oxadiazole,
2-(4'-tert-butylphenyl)-5-(4"-biphenyl)-1,3,4-oxadiazole,
2,5-bis(1-naphthyl)-1,3,4-oxadiazole,
1,4-bis[2-(5-phenyloxadiazolyl)]benzene, and
1,4-bis[2-(5-phenyloxadiazolyl)-4-tert-butylbenzene], and
the oxadiazole derivatives described in JP-A 2-216791;
2-(4'-tert-butylphenyl)-5-(4"-biphenyl)-1,3,4-triazole,
2,5-bis(1-naphthyl)-1,3,4-triazole, and
1,4-bis[2-(5-phenyltriazolyl)]benzene, and the triazole derivatives described in JP-A 7-90260; and
the phenanthroline derivatives described in JP-A 5-331459.

These compounds may have been converted to high molecular weight ones.

Of the foregoing electron transporting materials, oxadiazole and derivatives thereof are preferred. The preferred oxadiazole derivatives are dimers or more from the standpoint of film property. Asymmetric derivatives are preferred for solubility.

Illustrative examples of the preferred electron transporting compounds are given below as E1 to E6 and E13. Mw is a weight average molecular weight and n is a degree of polymerization.

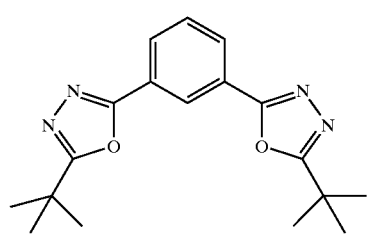

E-1

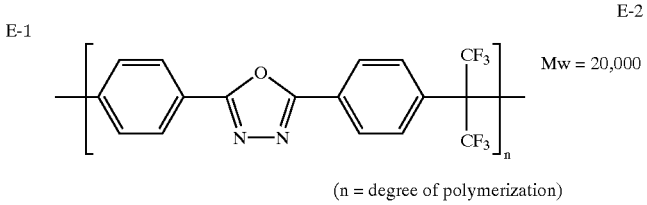

E-2

Mw = 20,000

(n = degree of polymerization)

-continued

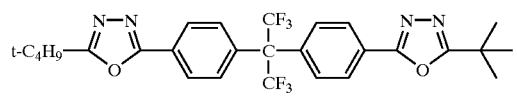
E-3

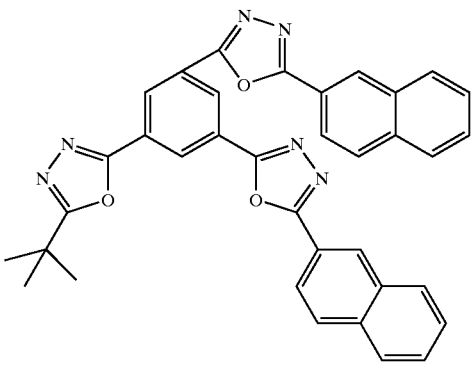
E-4

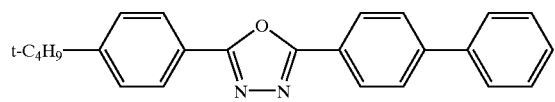
E-5

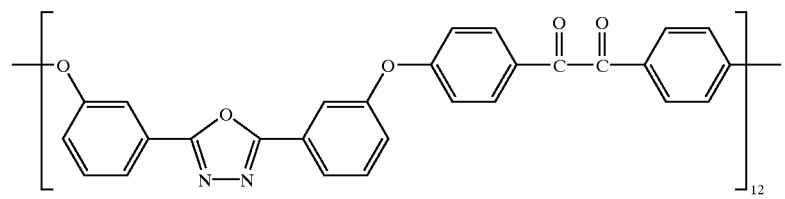
E-6

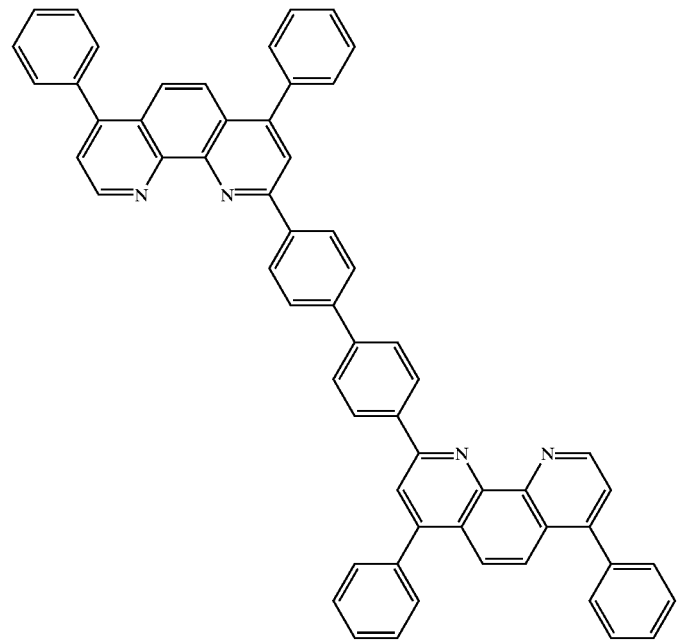
E-13

At least these organic layers are formed by a coating method. When the organic layers are formed by a coating method, the coating of the upper layer is desirably carried out after the lower layer is dried, that is, after at least 80% by weight of the solvent has been removed from the lower layer.

The upper layer used in combination with the lower layer is formed by coating. The coating solvent used to this end is preferably selected from among (i) a chain compound of 3 to 6 carbon atoms in total, having on the molecule at least one alkoxy group of 1 to 3 carbon atoms, carbonyl group, or ester group of 2 to 3 carbon atoms, and a hydroxyl group at the α- and/or β-position thereto, preferably at the α- or β-position, (ii) a chain compound of 3 to 6 carbon atoms in total, having on the molecule a dialkylamide group of 2 to 4 carbon atoms, (iii) an ester form of chain compound having 5 to 8 carbon atoms in total, and (iv) a carbonate form of chain compound having 4 to 7 carbon atoms in total, or a mixture of any.

The polar solvents described herein are unlikely to attack the organic EL material and are thus suited as the coating solvent for building up layers. The resulting film is found to contain no crystal grains upon microscope observation and to be amorphous by x-ray diffraction analysis. The amorphous film when assembled into a device has the advantage of a long lifetime due to minimized leakage and restrained function degradation. With respect to the compounds (i) and (ii), if the total number of carbon atoms is less than 3, a coating may dry too rapidly, failing to control the thickness of the organic layer to be uniform. With respect to the compounds (i) and (ii), if the total number of carbon atoms is more than 7, a coating may dry too slowly and have too high a viscosity, failing to control the thickness of the organic layer to be uniform. The total number of carbon atoms in the compounds (iii) and (iv) is limited for the same reason. In the case of saturated alcohols, a less number of carbon atoms may lead to a higher drying rate, undesirably inviting precipitation of the organic EL material and failing to form a coating. Too large a number of carbon atoms may slow the drying rate and lead to a lower solubility so that the organic EL material may not be dissolved. Aromatic and halogenated compounds are undesired in that most organic EL materials are dissolvable therein, and they can attack the underlying layer, causing leakage. Highly volatile esters such as ethyl acetate are difficult to form an amorphous coating because of too high a drying rate. Heterocyclic solvents such as THF can attack the underlying layer, causing leakage.

Examples of suitable organic solvents include 2-methoxyethanol, 2-ethoxyethanol, isopropyl cellosolve, methyl lactate, ethyl lactate, acetoin, diacetone alcohol, 4-hydroxybutanone, propioin, 2-hydroxy-2-methyl-3-butanone, dimethylformamide, dimethylacetamide, propyl acetate, butyl acetate, sec-butyl acetate, tert-butyl acetate, pentyl acetate, 2-methylbutyl acetate, 3-methylbutyl acetate, hexyl acetate, butyl formate, isobutyl formate, pentyl formate, isopentyl formate, hexyl formate, heptyl formate, ethyl butyrate, ethyl isobutyrate, propyl butyrate, isopropyl butyrate, propyl propionic acid, butyl propionic acid, tert-butyl propionic acid, sec-butyl propionic acid, methyl valerate, methyl isovalerate, ethyl valerate, ethyl isovalerate, ethyl methyl carbonate, diethyl carbonate, and dipropyl carbonate.

If necessary, a binder resin or the like may be admixed with the solvent.

In forming the organic layer, the organic material is preferably dissolved in the coating solvent mentioned above in a total concentration of 0.1 to 5% by weight. For the coating, solution coating methods such as spin coating, spray coating and dip coating may be used. After the coating, the coated structure may be heated on a hot plate or the like for drying off the solvent. The drying is preferably carried out in a partial vacuum or in an inert atmosphere by heating at a temperature in the range of about 50 to 280° C.

Figure 2:
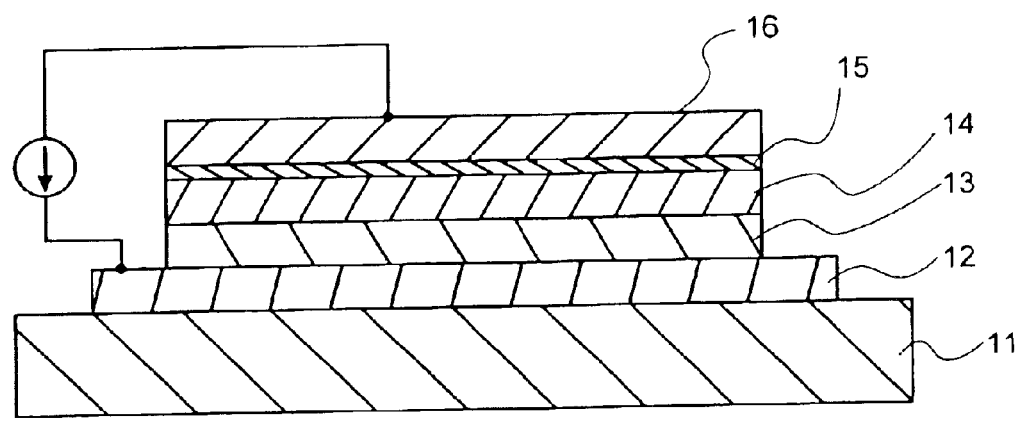
FIG. 2 is a schematic cross-sectional view of the basic construction of an organic EL device according to the second embodiment of the invention.

Referring to FIG. 2, the organic EL device according to the second embodiment of the invention has an anode 12 on a substrate 11 as the first electrode, organic layers including a light emitting layer 13 and another organic layer 14 thereon, and an inorganic electron injecting electrode 15 and a cathode 16 on the organic layers as the second electrode. In the organic EL device of the invention, depending on the type of a high molecular weight EL material used, coating solvent and other factors, it is acceptable that the first electrode be a cathode and the second electrode be an anode, and the construction of organic layers may be selected from a variety of compositions and is not critical. For a particular purpose, the high molecular weight EL material may be synthesized.

The two or more stacked organic layers in the second embodiment of the invention are often layers having different functions although it is acceptable in some cases that they be layers having an identical function (for example, they are light emitting layers).

If necessary, a hole injecting layer, hole transporting layer, electron injecting layer, electron transporting layer or the like may be provided as an additional organic layer. Also, a buffer layer of a mixture of poly(3,4-ethylene dioxythiophene) (PEDOT) and polystyrene sulfonic acid (PSS) may be provided for modifying the interface with an electrode of ITO or the like and enhancing the charge injecting ability.

Preferably the organic layer has a thickness of about 0.5 to 1000 nm, more preferably about 10 to 500 nm per layer when it is formed by a coating method, and about 1 to 500 nm when it is formed by an evaporation method such as vacuum evaporation.

The invention does not require for the cathode or electron injecting electrode to have a low work function and an electron injecting capability when combined with the electron injecting layer or the like. Then the cathode is not critical, and any of conventional metals may be used. For conductivity and ease of handling, a choice is preferably made among Al, Ag, In, Ti, Cu, Au, Mo, W, Pt, Pd and Ni, and mixtures thereof, and especially among Al and Ag. The cathode may be provided as a thin film having at least a thickness sufficient to provide electrons to the electron injecting and transporting layer or the like, typically at least 50 nm, preferably at least 100 nm. The upper limit of thickness is not critical although the film thickness is generally from about 50 nm to about 500 nm.

As the electron injecting electrode or cathode, use may be made of single metal elements such as K, Li, Na, Mg, La, Ce, Ca, Sr, Ba, Sn, Zn and Zr, and alloys of two or three of the foregoing elements for improving stability. Exemplary alloys are Ag-Mg (Ag: 0.1 to 50 at %), Al—Li (Li: 0.01 to 14 at %), In—Mg (Mg: 50 to 80 at %), Al—Ca (Ca: 0.01 to 20 at %), and LiF (F: 0.01 to 40 at %). Also, salts and oxides of the above metals may be used to form a high resistance inorganic electron injecting layer. Exemplary salts and oxides are insulating alkali metal compounds such as $Li_2O$, and $Li_2MoO_4$ and $RuO_2:Li_2O$. A further improved emission efficiency is achievable by combining such a layer.

The electron injecting electrode or cathode is in the form of a thin film which may have at least a sufficient thickness to effect electron injection, preferably a thickness of at least 0.1 nm, more preferably at least 0.5 nm, most preferably at least 1 nm. Although the upper limit is not critical, the electrode thickness is typically about 1 to about 500 nm. On the electron injecting electrode or cathode, an auxiliary electrode or protective electrode may be additionally provided. The total thickness of the electron injecting electrode and auxiliary electrode is not critical although it is usually about 50 to 500 nm.

The material of which the anode or hole injecting electrode is made is preferably a material capable of effectively injecting holes into the hole injecting and transporting layer or the like and having a work function of 4.5 to 5.5 eV. For example, materials based on tin-doped indium oxide (ITO), zinc-doped indium oxide (IZO), indium oxide ($In_2O_3$), tin oxide ($SnO_2$) or zinc oxide (ZnO) are preferable. These oxides may deviate somewhat from their stoichiometry.

Not only the hole injecting electrode, but the electrode on the light output side should preferably have a light transmittance of at least 50%, more preferably at least 80%, especially at least 90% in the light emission band, typically from 400 to 700 nm, and especially at each light emission. With a lower transmittance, the light emitted by the light emitting layer would be attenuated through the electrode, failing to provide a luminance necessary as a light emitting device.

The hole injecting electrode preferably has a thickness of 50 to 500 nm, especially 50 to 300 nm. Although the upper limit of the electrode thickness is not critical, a too thick electrode would invite a lowering of transmittance and the risk of separation. Too thin an electrode would be less effective and have a problem associated with film strength during fabrication.

In either of the first and second embodiments of the invention, a sealing layer or plate is preferably provided on the device in order to prevent the organic layers and electrodes from degradation.

In either of the first and second embodiments of the invention, the substrate in the organic EL device may be selected from amorphous substrates such as glass and quartz and crystalline substrates such as Si, GaAs, ZnSe, ZnS, GaP, and InP. If desired, buffer layers of crystalline materials, amorphous materials or metals may be formed on such crystalline substrates. Metal substrates including Mo, Al, Pt, Ir, Au and Pd are also useful. Of these, glass substrates are preferred. When the substrate is often situated on the light output side, the substrate should preferably have a light transmittance as described above for the electrode.

A plurality of inventive EL devices may be arranged on a plane. A color display is arrived at by changing the emission color of such planar arranged devices. The emission color may also be controlled by providing a color filter film, a color conversion film (containing a fluorescent substance) or a dielectric reflecting film on the substrate.

The organic EL device of the invention is generally of the DC or pulse drive type. It may be of the AC drive type. The applied voltage is generally about 2 to 30 volts.

EXAMPLE

Examples are given below for illustrating the invention, but are not construed as limiting the invention thereto.

Example 1

On a glass substrate having formed thereon an indium tin oxide (ITO) anode with a thickness of 200 nm and a sheet resistivity of 15 $\Omega/\square$, a hole injecting layer was formed by spin coating Baytron P (an aqueous dispersion of a polymer of polyethylene dioxide thiophene with polystyrene sulfonic acid, by Bayer AG) to a thickness of 40 nm.

Next, a hole transporting and light emitting layer was formed. It was formed by dissolving a poly(aryl fluorene) derivative which is the compound of formula (P-2) in toluene solvent in a concentration of 1.5% by weight, and spin coating the solution to a thickness of 70 nm.

Next, an electron injecting organic layer was formed. It was formed by dissolving a mixture of 50 mol % an oxadiazole derivative which is the illustrated compound E-1 and 50 mol % mono(acetylacetonato)sodium complex (Na (acac)) which is the illustrated compound C-1 in ethyl cellosolve solvent in a concentration of 0.5% by weight and spin coating the solution to a thickness of 10 nm.

The coated structure was dried in vacuum at 50° C. for one hour. The film thickness described above is a thickness after vacuum drying.

A cathode was then formed on the structure. The cathode or auxiliary electrode was formed by evaporating Al to a thickness of 200 nm.

The thus obtained organic EL device produced a luminance of 1500 cd/m$^2$ at a current density of 10 mA/cm$^2$ and a drive voltage of 3.5 V. It emitted green light. When driven in Ar gas at a constant current density of 10 mA/cm$^2$, it had a luminance half-life of 600 hours.

Example 2

An organic EL device was fabricated as in Example 1, except that the electron injecting organic layer was formed using a polymer which is the illustrated compound E-2 instead of the oxadiazole compound E-1 and dimethylacetamide instead of ethyl cellosolve as the solvent. The organic EL device produced a luminance of 1500 cd/m$^2$ at a current density of 10 mA/cm$^2$ and a drive voltage of 3.7 V. It emitted green light. When driven in Ar gas at a constant current density of 10 mA/cm$^2$, it had a luminance half-life of 500 hours.

Example 3

An organic EL device was fabricated as in Example 1, except that the electron injecting organic layer was formed using a thiadiazole derivative which is the illustrated compound E-18 instead of the oxadiazole compound E-1 and dimethylacetamide instead of ethyl cellosolve as the solvent. The organic EL device produced a luminance of 2000 cd/m$^2$ at a current density of 10 mA/cm$^2$ and a drive voltage of 3.7 V. It emitted green light. When driven in Ar gas at a constant current density of 10 mA/cm$^2$, it had a luminance half-life of 500 hours.

Example 4

An organic EL device was fabricated as in Example 1, except that the electron injecting organic layer was formed using a mixture of 75 mol % a triazole derivative which is the illustrated compound E-10 and 25 mol % mono (acetylacetonato)potassium complex (K(acac)) which is the illustrated compound C-2. The organic EL device produced a luminance of 1200 cd/m$^2$ at a current density of 10 mA/cm$^2$ and a drive voltage of 3.9 V. It emitted green light. When driven in Ar gas at a constant current density of 10 mA/cm$^2$, it had a luminance half-life of 440 hours.

Example 5

An organic EL device was fabricated as in Example 1, aside from using Ag instead of Al as the auxiliary electrode. The organic EL device produced a luminance of 1000 cd/m$^2$ at a current density of 10 mA/cm$^2$ and a drive voltage of 3.8 V. It emitted green light. When driven in Ar gas at a constant current density of 10 mA/cm$^2$, it had a luminance half-life of 320 hours.

Example 6

An organic EL device was fabricated as in Example 1, aside from using Ba(acac)$_2$ which is the illustrated compound C-13 instead of the illustrated compound C-1 as the organic metal salt or organic metal complex in the electron injecting organic layer. The organic EL device produced a luminance of 2000 cd/m$^2$ at a current density of 10 mA/cm$^2$ and a drive voltage of 4 V. It emitted green light. When driven in Ar gas at a constant current density of 10 mA/cm$^2$, it had a luminance half-life of 500 hours.

Comparative Example 1

An organic EL device was fabricated as in Example 1, aside from evaporating calcium to a thickness of 6 nm instead of the electron injecting organic layer. The organic EL device produced a luminance of 900 cd/m$^2$ at a current density of 10 mA/cm$^2$ and a drive voltage of 3.9 V. It emitted green light. When driven in Ar gas at a constant current density of 10 mA/cm$^2$, it had a luminance half-life of 120 hours.

Comparative Example 2

On ITO, a hole transporting layer of N,N'-di(naphthalen-1-yl)-N,N'-diphenyl benzidine (α-NPD) and a light emitting layer of tris(8-quinolinolato)aluminum (Alq3) were successively formed by evaporation to a thickness of 50 nm and 50 nm, respectively. An electron injecting organic layer was formed thereon by dissolving a mixture of 50 mol % tris(8-quinolinolato)aluminum (Alq3) and 50 mol % mono(8-quinolinolato)lithium (Liq) in dimethylformamide solvent in a concentration of 0.5% by weight, and spin coating the solution. The spin coating solution attacked the lower layer. No EL emission was produced.

Comparative Example 3

An organic EL device was fabricated as in Example 1, aside from using an acetylacetonato complex of Al (III) with a standard electrode potential of −1.695 V at 25° C. and a work function of 4.3 eV, having the structure shown below, instead of the illustrated compound C-1 in the electron injecting organic layer. The organic EL device produced a luminance of 2 cd/m² at a current density of 10 mA/cm² and a drive voltage of 7.5 V. It emitted green light. An apparent drop of emission efficiency was ascertained.

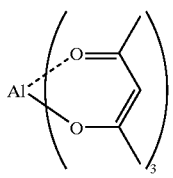

Example 7

An organic EL device was fabricated as in Example 1, aside from dissolving a mixture of 50 mol % tris(8-quinolinolato)aluminum (Alq3) which is the illustrated compound E-15 and 50 mol % mono(8-quinolinolato)lithium (Liq) which is the illustrated compound C-10 in dimethylformamide solvent in a concentration of 0.5% by weight, and spin coating the solution to form an electron injecting organic layer of 30 nm thick. The organic EL device produced a luminance of 800 cd/m² at a current density of 10 mA/cm² and a drive voltage of 4.2 V. It emitted green light. When driven in Ar gas at a constant current density of 10 mA/cm², it had a luminance half-life of 250 hours.

Example 8

An organic EL device was fabricated as in Example 1, except that the electron injecting organic layer was formed using 100 mol % Ca(acac)₂ which is the illustrated compound C-8 instead of the illustrated compound C-1 and the illustrated compound E-1. The organic EL device produced a luminance of 2000 cd/m² at a current density of 10 mA/cm² and a drive voltage of 4.0 V. It emitted green light. When driven at a constant current density of 10 mA/cm², it had a luminance half-life of 400 hours.

Comparative Example 4

An organic EL device was fabricated as in Example 8, except that the electron injecting organic layer was formed by using 100 mol % the illustrated compound C-8 and evaporating it. The organic EL device produced a luminance of 800 cd/m² at a current density of 10 mA/cm² and a drive voltage of 6.8 V. It emitted green light. When driven at a constant current density of 10 mA/cm², it had a luminance half-life of 100 hours.

Example 9

An organic EL device was fabricated as in Example 1, except that the electron injecting organic layer was formed using 50 mol % the illustrated compound C-8 and 50 mol % an aluminum quinolinolato complex which is the illustrated compound E-14 instead of the illustrated compounds C-1 and E-1. The organic EL device produced a luminance of 2100 cd/m² at a current density of 10 mA/cm² and a drive voltage of 4.0 V. It emitted green light. When driven at a constant current density of 10 mA/cm², it had a luminance half-life of 500 hours.

Example 10

An organic EL device was fabricated as in Example 1, except that the electron injecting organic layer was formed by using 95 wt % the illustrated compound C-8 and 5 wt % a modified silicone resin (SR2102 by Dow Corning-Toray Co., Ltd.), coating the solution, and allowing the coating to cure at room temperature for 3 hours. The organic EL device produced a luminance of 1300 cd/m² at a current density of 10 mA/cm² and a drive voltage of 5.5 V. It emitted green light. When driven at a constant current density of 10 mA/cm², it had a luminance half-life of 500 hours.

Example 11

An organic EL device was fabricated as in Example 1, aside from using 100 mol % a Ca salt of polymer which is the illustrated compound C-18 instead of the illustrated compounds C-1 and E-1 in the electron injecting organic layer. The organic EL device produced a luminance of 2000 cd/m² at a current density of 10 mA/cm² and a drive voltage of 5.0 V. It emitted green light. When driven at a constant current density of 10 mA/cm², it had a luminance half-life of 300 hours.

Example 12

An organic EL device was fabricated as in Example 1, aside from using 50 mol % a phenanthroline calcium complex which is the illustrated compound C-17 and 50 mol % the illustrated compound E-1 instead of the illustrated compounds C-1 and E-1 in the electron injecting organic layer. The organic EL device produced a luminance of 2000 cd/m² at a current density of 10 mA/cm² and a drive voltage of 3.8 V. It emitted green light. When driven at a constant current density of 10 mA/cm², it had a luminance half-life of 300 hours.

Example 13

An organic EL device was fabricated as in Example 1, aside from using 50 mol % a calcium alkoxide which is the illustrated compound C-19 and 50 mol % the illustrated compound E-14 instead of the illustrated compounds C-1 and E-1 in the electron injecting organic layer. The organic EL device produced a luminance of 1900 cd/m² at a current density of 10 mA/cm² and a drive voltage of 3.8 V. It emitted green light. When driven at a constant current density of 10 mA/cm², it had a luminance half-life of 500 hours.

Example 14

An organic EL device was fabricated as in Example 1, aside from using 100 mol % a samarium alkoxide which is the illustrated compound C-26 instead of the illustrated compounds C-1 and E-1 in the electron injecting organic layer. The organic EL device produced a luminance of 1600 cd/m² at a current density of 10 mA/cm² and a drive voltage of 4.8 V. It emitted green light. When driven at a constant current density of 10 mA/cm², it had a luminance half-life of 300 hours.

Example 15

An organic EL device was fabricated as in Example 1, aside from using 100 mol % a bathophenanthroline europium complex which is the illustrated compound C-12 instead of the illustrated compounds C-1 and E-1 in the electron injecting organic layer. The organic EL device produced a luminance of 1600 cd/m² at a current density of 10 mA/cm² and a drive voltage of 3.7 V. It emitted green light. When driven at a constant current density of 10 mA/cm², it had a luminance half-life of 350 hours.

Example 16

An organic EL device was fabricated as in Example 1, aside from using 50 mol % barium acetate which is the illustrated compound C-25 and 50 mol % the illustrated compound E-14 instead of the illustrated compounds C-1 and E-1 in the electron injecting organic layer. The organic EL device produced a luminance of 1500 cd/m² at a current density of 10 mA/cm² and a drive voltage of 4.0 V. It emitted green light. When driven at a constant current density of 10 mA/cm², it had a luminance half-life of 500 hours.

Example 17

On a glass substrate having formed thereon an indium tin oxide (ITO) anode with a thickness of 200 nm and a sheet resistivity of 15 Ω/□, a hole injecting layer was formed by spin coating Baytron P (an aqueous dispersion of a polymer of polyethylene dioxide thiophene with polystyrene sulfonic acid, by Bayer AG) to a thickness of 40 nm.

Next, a hole transporting and light emitting layer was formed. It was formed by dissolving a poly(aryl fluorene) derivative which is the compound of formula (P-2) in toluene solvent in a concentration of 1.5% by weight, and spin coating the solution to a thickness of 70 nm.

Next, an electron injecting layer was formed. It was formed by dissolving aluminum triethoxide in ethyl cellosolve solvent in a concentration of 0.5% by weight and spin coating the solution to a thickness of 3 nm.

The coated structure was dried in vacuum at 50° C. for one hour. The film thickness described above is a thickness after vacuum drying.

A cathode was then formed on the structure. The cathode was formed by evaporating Al to a thickness of 200 nm.

The thus obtained device, when operated in an argon gas atmosphere, initially produced a luminance of 1800 cd/m² at a current density of 10 mA/cm² and a drive voltage of 3.8 V. When driven in Ar gas at a constant current density of 10 mA/cm², it had a luminance half-life of 600 hours.

Example 18

A device was fabricated as in Example 17, except that the electron injecting layer was formed using a mixture of aluminum triethoxide and tris(8-quinolinolato)aluminum (Alq3) in a weight ratio of 1:1 instead of aluminum triethoxide. In a similar test, the device initially produced a luminance of 1500 cd/m² at a current density of 10 mA/cm² and a drive voltage of 4.4 V. When driven in Ar gas at a constant current density of 10 mA/cm², it had a luminance half-life of 500 hours.

Example 19

A device was fabricated as in Example 17, except that the electron injecting layer was formed using a polymer aluminum salt of the structure shown below instead of aluminum triethoxide.

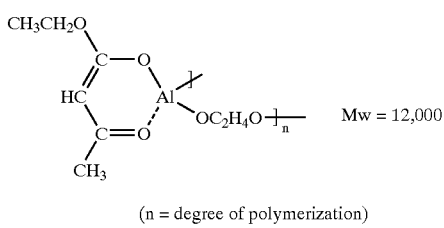

(n = degree of polymerization)

In a similar test, the device initially produced a luminance of 1800 cd/m² at a current density of 10 mA/cm² and a drive voltage of 4.2 V. When driven in Ar gas at a constant current density of 10 mA/cm², it had a luminance half-life of 800 hours.

Example 20

A device was fabricated as in Example 17, except that the electron injecting layer was formed by using aluminum triphenoxide instead of aluminum triethoxide and evaporating it to a thickness of 1 nm. In a similar test, the device initially produced a luminance of 1500 cd/m² at a current density of 10 mA/cm² and a drive voltage of 4.0 V. When driven in Ar gas at a constant current density of 10 mA/cm², it had a luminance half-life of 450 hours.

Example 21

A device was fabricated as in Example 17, except that the electron injecting layer was formed to a thickness of 3 nm using manganese acetate instead of aluminum triethoxide. In a similar test, the device initially produced a luminance of 500 cd/m² at a current density of 10 mA/cm² and a drive voltage of 4.4 V. When driven in Ar gas at a constant current density of 10 mA/cm², it had a luminance half-life of 250 hours.

Example 22

A device was fabricated as in Example 17, except that the electron injecting layer was formed to a thickness of 3 nm using tetrapropoxyzirconium instead of aluminum triethoxide. In a similar test, the device initially produced a luminance of 600 cd/m² at a current density of 10 mA/cm² and a drive voltage of 4.4 V. When driven in Ar gas at a constant current density of 10 mA/cm², it had a luminance half-life of 300 hours.

Comparative Example 5

A device was fabricated as in Example 17, aside from forming a calcium layer of 6 nm thick by evaporation instead of the aluminum triethoxide layer. In a similar test, the device initially produced a luminance of 900 cd/m² at a current density of 10 mA/cm² and a drive voltage of 3.9 V. When driven in Ar gas at a constant current density of 10 mA/cm², it had a luminance half-life of 120 hours.

Comparative Example 6

A device was fabricated as in Example 17, except that the electron injecting layer of aluminum triethoxide was omitted. In a similar test, the device produced no light emission as demonstrated by an initial luminance of 0 cd/m² at a current density of 10 mA/cm², with the voltage being 7.0 V.

Comparative Example 7

A device was fabricated as in Example 17, aside from forming a tris(8-quinolinolato)aluminum (Alq3) layer of 2 nm thick by evaporation instead of the aluminum triethoxide layer. In a similar test, the device initially produced a luminance of 100 cd/m² at a current density of 10 mA/cm² and a drive voltage of 6.0 V. When driven in Ar gas at a constant current density of 10 mA/cm², it had a luminance half-life of 80 hours.

Example 23

On a glass substrate having formed thereon an indium tin oxide (ITO) anode with a thickness of 200 nm and a sheet resistivity of 15 Ω/□, a hole injecting layer was formed by spin coating Baytron P (an aqueous dispersion of a polymer of polyethylene dioxide thiophene with polystyrene sulfonic acid, by Bayer AG) to a thickness of 40 nm.

Next, a hole transporting and light emitting layer was formed. It was formed by dissolving a polymer of the structure shown below in toluene solvent in a concentration of 1.5% by weight, and spin coating the solution to a thickness of 70 nm.

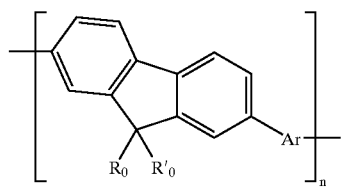

Herein, $R_0$ and $R_0'$ each are alkyl, Ar is an aromatic ring or heterocyclic group which may be substituted, n is a degree of polymerization, and Mw is 5,000 to 3,000,000.

Next, an electron injecting layer was formed. It was formed by dissolving an oxadiazole of the structure shown below in ethyl cellosolve solvent in a concentration of 1.0% by weight and spin coating the solution to a thickness of 20 nm.

OXD

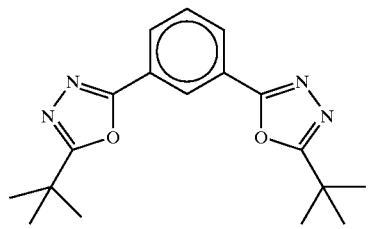

The coated structure was dried in vacuum at 50° C. for one hour. The film thickness described above is a thickness after vacuum drying.

A cathode was then formed on the structure. The cathode was formed by evaporating LiF to a thickness of 0.5 nm and subsequently evaporating Al to a thickness of 100 nm as an auxiliary electrode.

The thus obtained organic EL device produced a luminance of 2200 cd/m² at a current density of 10 mA/cm². When driven in Ar gas at a constant current density of 10 mA/cm², it had a luminance half-life of 600 hours.

Example 24

A device was fabricated as in Example 23, except that a dimethylacetamide solution of a polyoxadiazole having the structure shown below was used instead of the ethyl cellosolve solution of OXD.

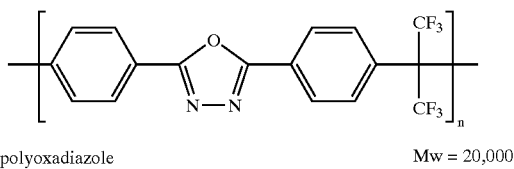

polyoxadiazole    Mw = 20,000 n = degree of polymerization

The device produced a luminance of 1500 cd/m² at a current density of 10 mA/cm². When driven in Ar gas at a constant current density of 10 mA/cm², it had a luminance half-life of 500 hours.

Comparative Example 8

A device was fabricated as in Example 23, except that a tris(8-quinolinolato)aluminum (Alq3) layer of 30 nm thick was formed by vacuum evaporation instead of the OXD layer. In a similar test, the device produced a luminance of 800 cd/m² at a current density of 10 mA/cm². When driven in Ar gas at a constant current density of 10 mA/cm², it had a luminance half-life of 120 hours.

Comparative Example 9

A device was fabricated as in Example 23, except that the OXD layer and the LiF film were omitted, and instead, metallic Ca was deposited to a thickness of 6 nm as an electron injecting electrode or cathode. In a similar test, the device produced a luminance of 900 cd/m² at a current density of 10 mA/cm². When driven in Ar gas at a constant current density of 10 mA/cm², it had a luminance half-life of 120 hours.

In the first embodiment of the invention, an organic EL device of the coating type can be readily manufactured which has the advantages of a high efficiency, high reliability and ease of handling as well as a high luminance and a long lifetime. The device can be driven with a low voltage due to the use of a metal salt of a stable metal species in an electron injecting layer, is easy to handle and has a long luminance half-life. In the second embodiment of the invention, an organic EL device is provided which enables a multilayer structure of organic layers to be formed by coating, and has a high emission efficiency and a long life.

Japanese Patent Application Nos. 2001-249456, 2001-253409 and 2002-076430 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An organic EL device comprising a cathode, an anode, and two or more stacked organic layers therebetween including a light emitting layer, at least two organic layers being formed by coating, wherein the organic layer disposed contiguous to the cathode is an electron injecting organic layer containing at least one compound selected from organic metal salts and organic metal complexes of a metal having a standard electrode potential of more negative than −1.8 V at 25° C., and formed by coating, and an organic layer containing a high molecular weight EL material is disposed contiguous to the electron injecting organic layer on the cathode side, and formed by coating, wherein the electron injecting organic layer is formed by coating a solution of the at least one compound in a solvent which is selected from the group consisting of (i) a chain compound of 3 to 6 carbon atoms in total, having on the molecule at least one alkoxy group of 1 to 3 carbon atoms, carbonyl group, or ester group of 2 to 3 carbon atoms, and a hydroxyl group at the α- and/or β-position thereto, (ii) a chain compound of 3 to 6 carbon atoms in total, having on the molecule a dialkylamide group of 2 to 4 carbon atoms, (iii) an ester form of chain compound having 5 to 8 carbon atoms in total, (iv) a carbonate form of chain compound having 4 to 7 carbon atoms in total, and (v) mixtures thereof.

2. An organic EL device according to claim 1 wherein said metal has a standard electrode potential of from −3.1 V to −2.2 V at 25° C.

3. An organic EL device according to claim 1 wherein said metal has a work function of up to 3.8 eV.

4. An organic EL device according to claim 1 wherein said metal is an alkali metal (I), alkaline earth metal (II) or rare earth metal (III).

5. An organic EL device according to claim 1 wherein the electron injecting organic layer contains an organic metal complex which has a ligand of the following formula (L-1):

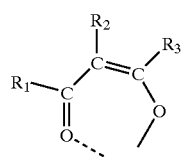

(L-1)

wherein $R_1$, $R_2$ and $R_3$ are each independently hydrogen, an alkyl or aryl group, and $R_2$ and $R_3$ may bond together to form a ring.

6. An organic EL device according to claim 1 wherein the high molecular weight EL material has a weight average molecular weight of at least 5,000.

7. An organic EL device according to claim 6 wherein the high molecular weight EL material is selected from the group consisting of polyfluorene and derivatives thereof, poly(p-phenylene vinylene) and derivatives thereof, poly(biphenylene vinylene) and derivatives thereof, poly(terphenylene vinylene) and derivatives thereof, poly(naphthylene vinylene) and derivatives thereof, poly(thienylene vinylene) and derivatives thereof, polythiophene and derivatives thereof, polyvinyl compounds, polyacrylate derivatives, and polymethacrylate derivatives.

8. An organic EL device according to claim 1 wherein the electron injecting organic layer further contains an electron transporting material which is a compound having an oxadiazole ring, triazole ring, quinoxaline ring, phenanthroline ring, quinolinol ring, thiadiazole ring, pyridine ring or cyano group.

9. An organic EL device according to claim 1 wherein the electron injecting organic layer is crosslinked after coating.

10. An organic EL device comprising, in order, a substrate, a first electrode on the substrate, two or more stacked organic layers on the first electrode including a light emitting layer, and a second electrode on the organic layers, wherein at least one layer of the two or more stacked organic layers other than the light emitting layer contains at least one high or low molecular weight compound selected from the group consisting of oxadiazole, triazole, thiadiazole, quinoline, quinoxaline, phenanthroline, and derivatives thereof, the light emitting layer contains a polymer which is a π-conjugated polymer, polyvinyl compound, polyacrylate, polymethacrylate or a derivative thereof, and the organic layers are formed by coating, wherein the at least one layer containing at least one high or low molecular weight compound is formed by coating a solution of the at least one high or low molecular weight compound in a solvent which is selected from the group consisting of (i) a chain compound of 3 to 6 carbon atoms in total, having on the molecule at least one alkoxy group of 1 to 3 carbon atoms, carbonyl group, or ester group of 2 to 3 carbon atoms, and a hydroxyl group at the α- and/or β-position thereto, (ii) a chain compound of 3 to 6 carbon atoms in total, having on the molecule a dialkylamide group of 2 to 4 carbon atoms, (iii) an ester form of chain compound having 5 to 8 carbon atoms in total, (iv) a carbonate form of chain compound having 4 to 7 carbon atoms in total, and (v) mixtures thereof.

11. An organic EL device according to claim 10 wherein the second electrode is made of a metal salt, metal oxide or metal alloy.

12. An organic EL device according to claim 10, wherein the first electrode is an anode, the second electrode is a cathode, the light emitting layer is formed as a lower side organic layer, the at least one layer containing at least one high or low molecular weight compound is formed as an upper side organic layer lying on the lower side organic layer.

13. An organic EL device according to claim 10 wherein the polymer in the light emitting layer has a weight average molecular weight of at least 5,000.

14. An organic EL device according to claim 21 wherein the polymer in the light emitting layer is selected from the group consisting of polyfluorene and derivatives thereof, poly(p-phenylene vinylene) and derivatives thereof, poly(biphenylene vinylene) and derivatives thereof, poly(terphenylene vinylene) and derivatives thereof, poly(naphthylene vinylene) and derivatives thereof, poly(thienylene vinylene) and derivatives thereof, polythiophene and derivatives thereof, polyvinyl compounds, polyacrylate derivatives, and polymethacrylate derivatives.

* * * * *